United States Patent [19]

Reinert

[11] 4,301,379
[45] Nov. 17, 1981

[54] LATCHING SCHMITT TRIGGER CIRCUIT

[75] Inventor: John R. Reinert, Colorado Springs, Colo.

[73] Assignee: NCR Corporation, Dayton, Ohio

[21] Appl. No.: 85,827

[22] Filed: Oct. 17, 1979

[51] Int. Cl.³ ........................................... H03K 3/295
[52] U.S. Cl. .................................. 307/290; 307/291; 328/206
[58] Field of Search ................ 307/290, 291; 328/203, 328/206

[56] References Cited

U.S. PATENT DOCUMENTS 3,341,747  9/1967  Halfhill et al. ................... 307/290 X
3,666,970  5/1972  Abbott et al. .................... 307/290 X Primary Examiner—James B. Mullins
Attorney, Agent, or Firm—J. T. Cavender; Philip A. Dalton; Arthur A. Sapelli

[57] ABSTRACT

A basic Schmitt trigger circuit is modified with additional circuit components for a two-input bistable circuit (latch). The latching Schmitt trigger circuit exhibits enhanced operating characteristics, such as fast and reliable switching between stable states. Also the circuit is compatible with design parameters and operating tolerances of integrated circuits. The latching Schmitt trigger circuit enables implementation of a fast reliable arbitration circuit in an integrated circuit version by minimizing the necessary time delay between the end of a resource request signal period and the start of an interrogate signal period.

8 Claims, 39 Drawing Figures

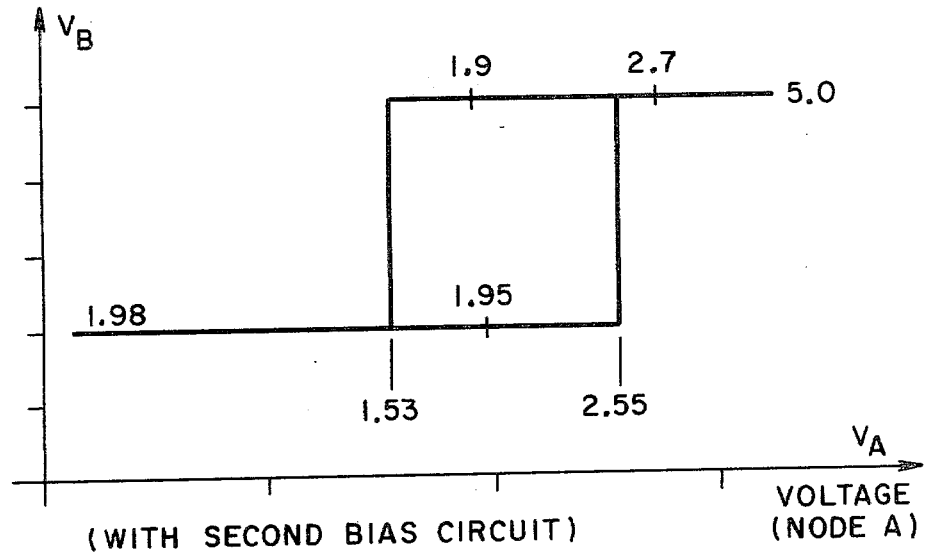
FIG. 6F (WITH SECOND BIAS CIRCUIT)
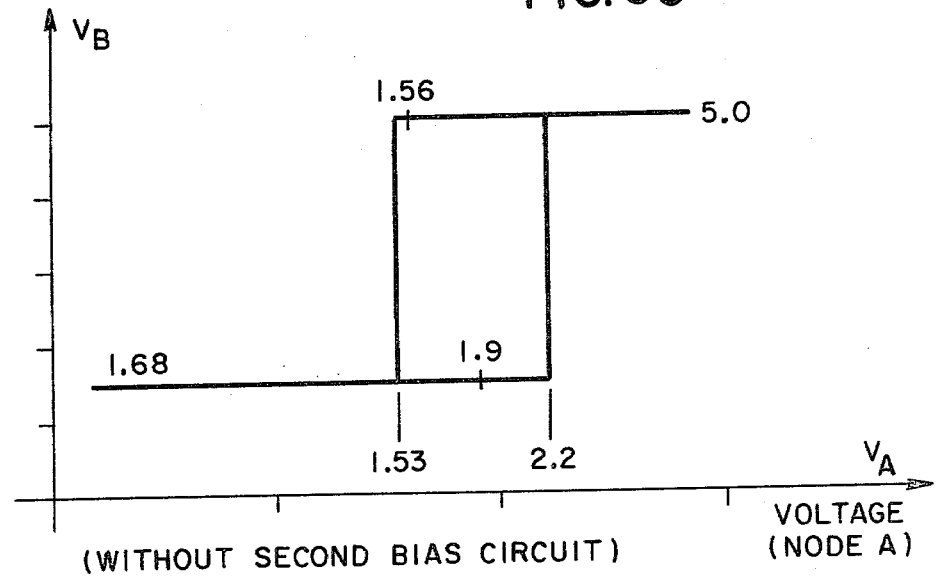
FIG. 6G (WITHOUT SECOND BIAS CIRCUIT)

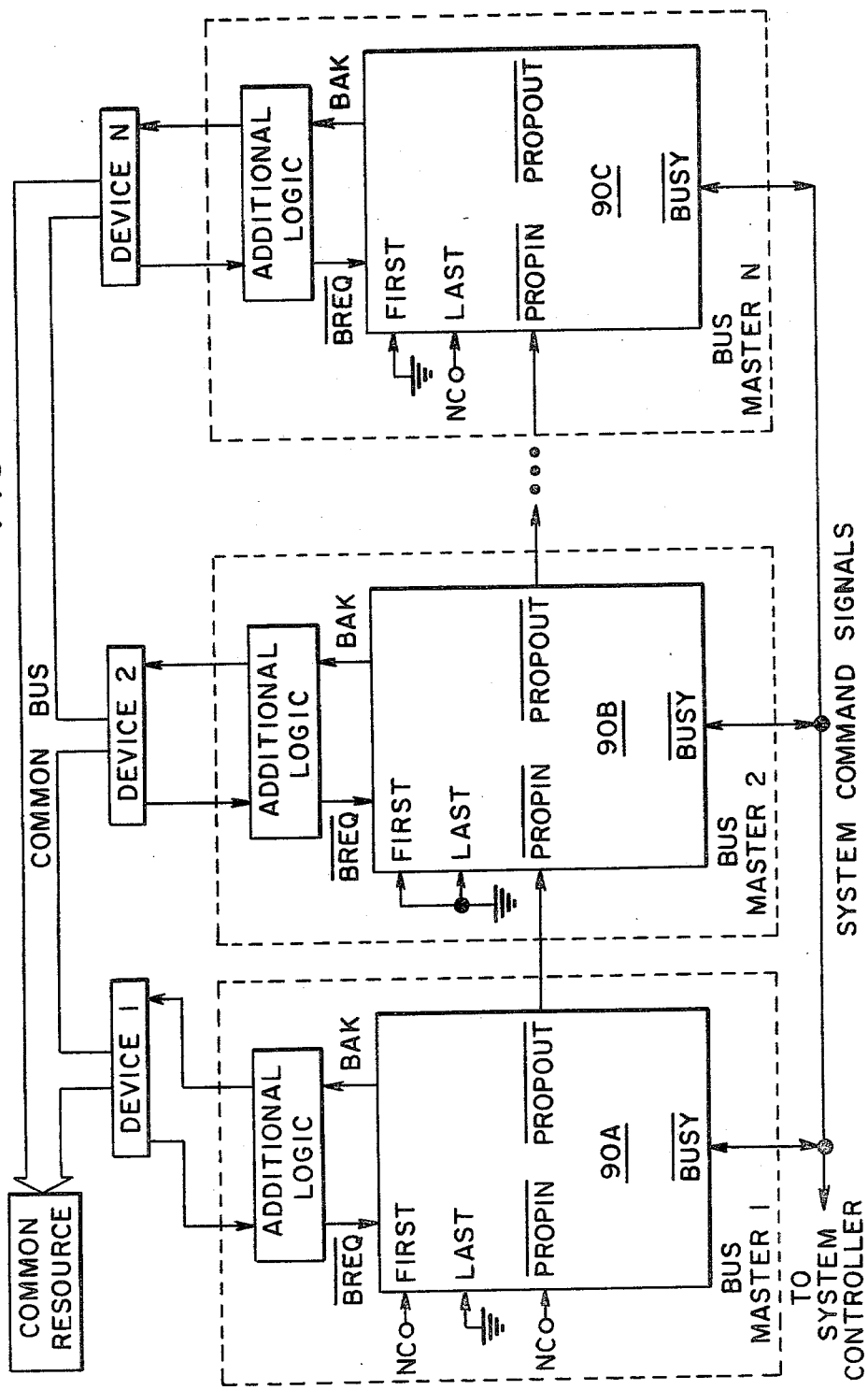

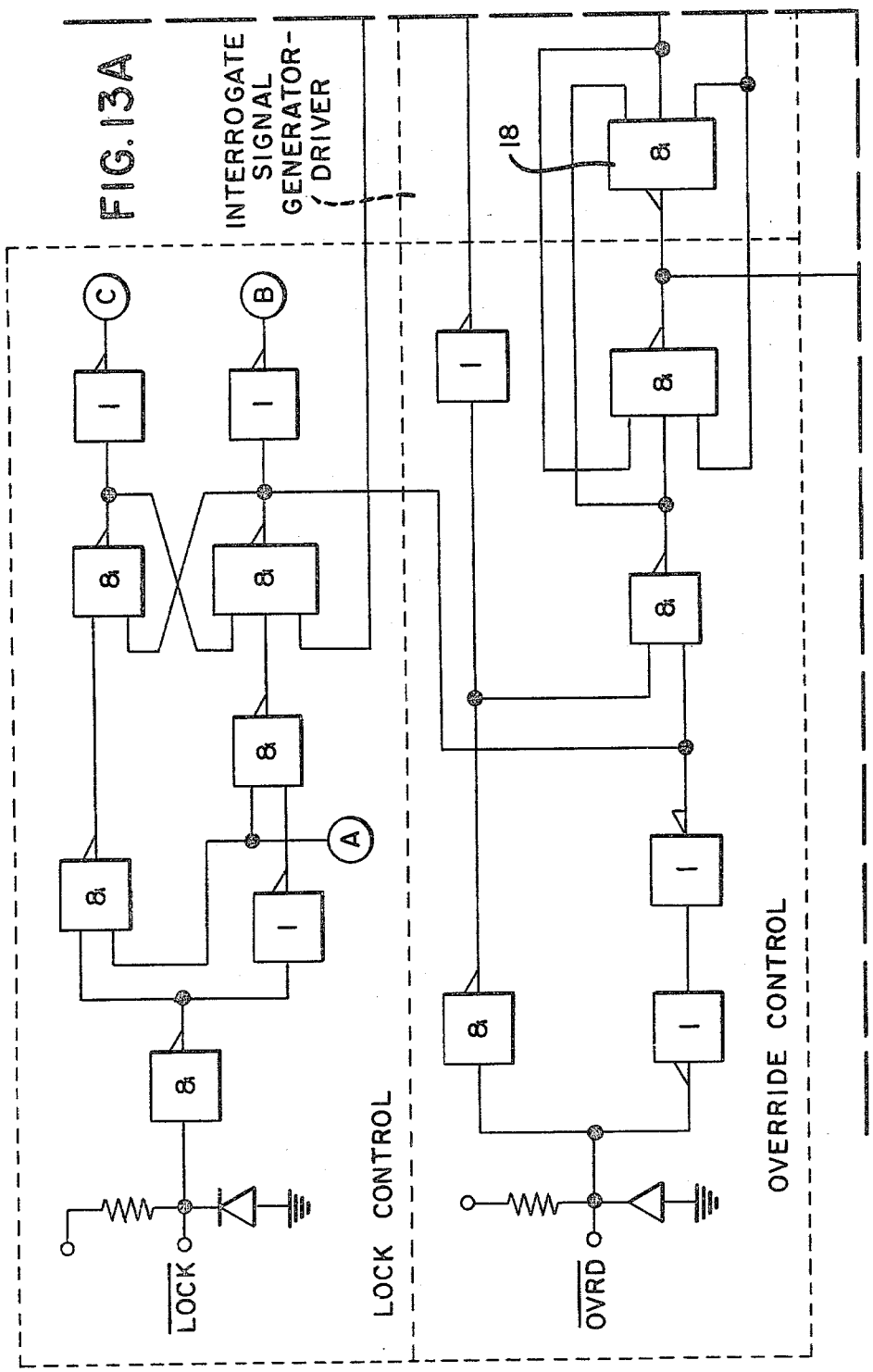

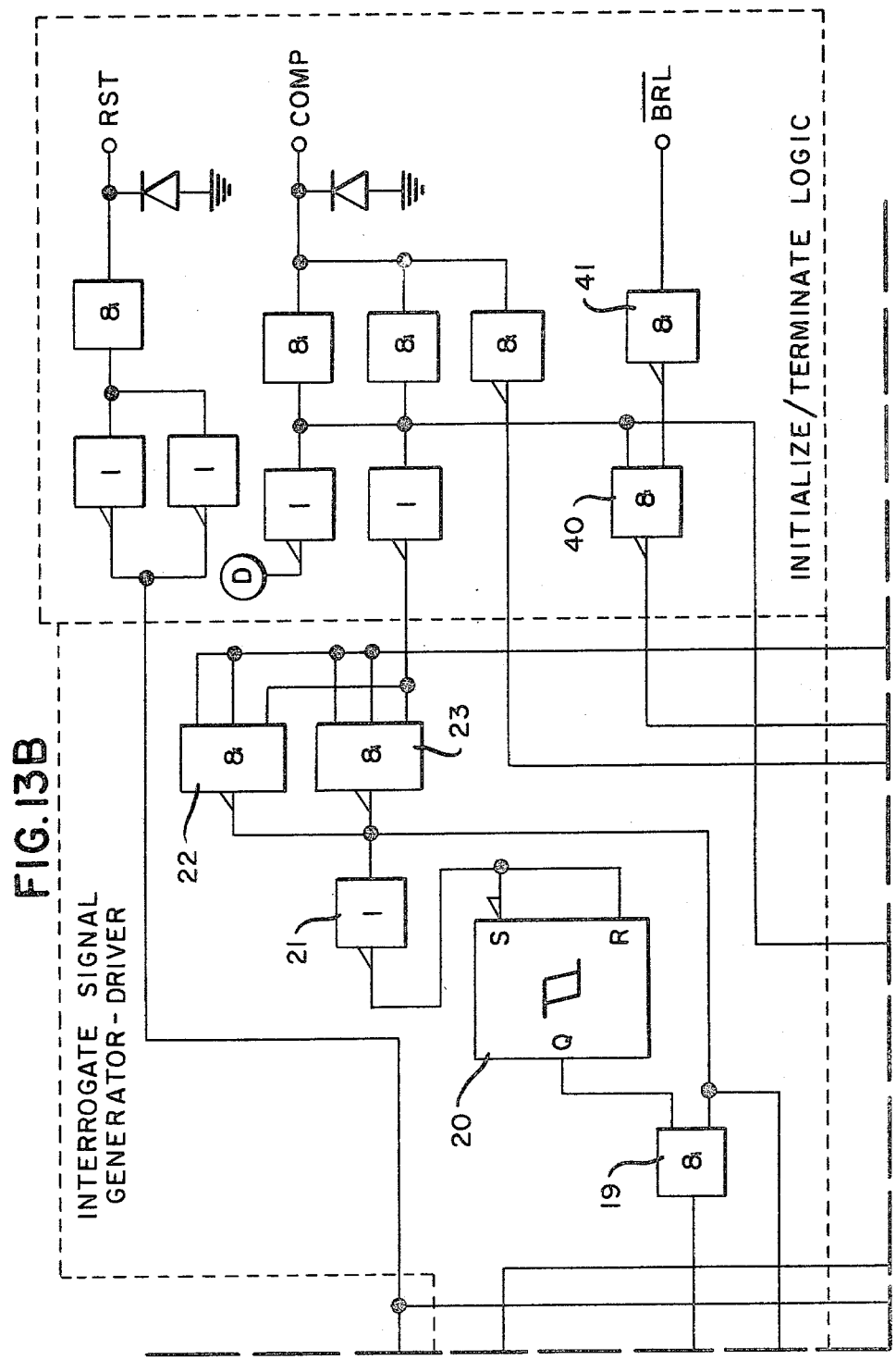

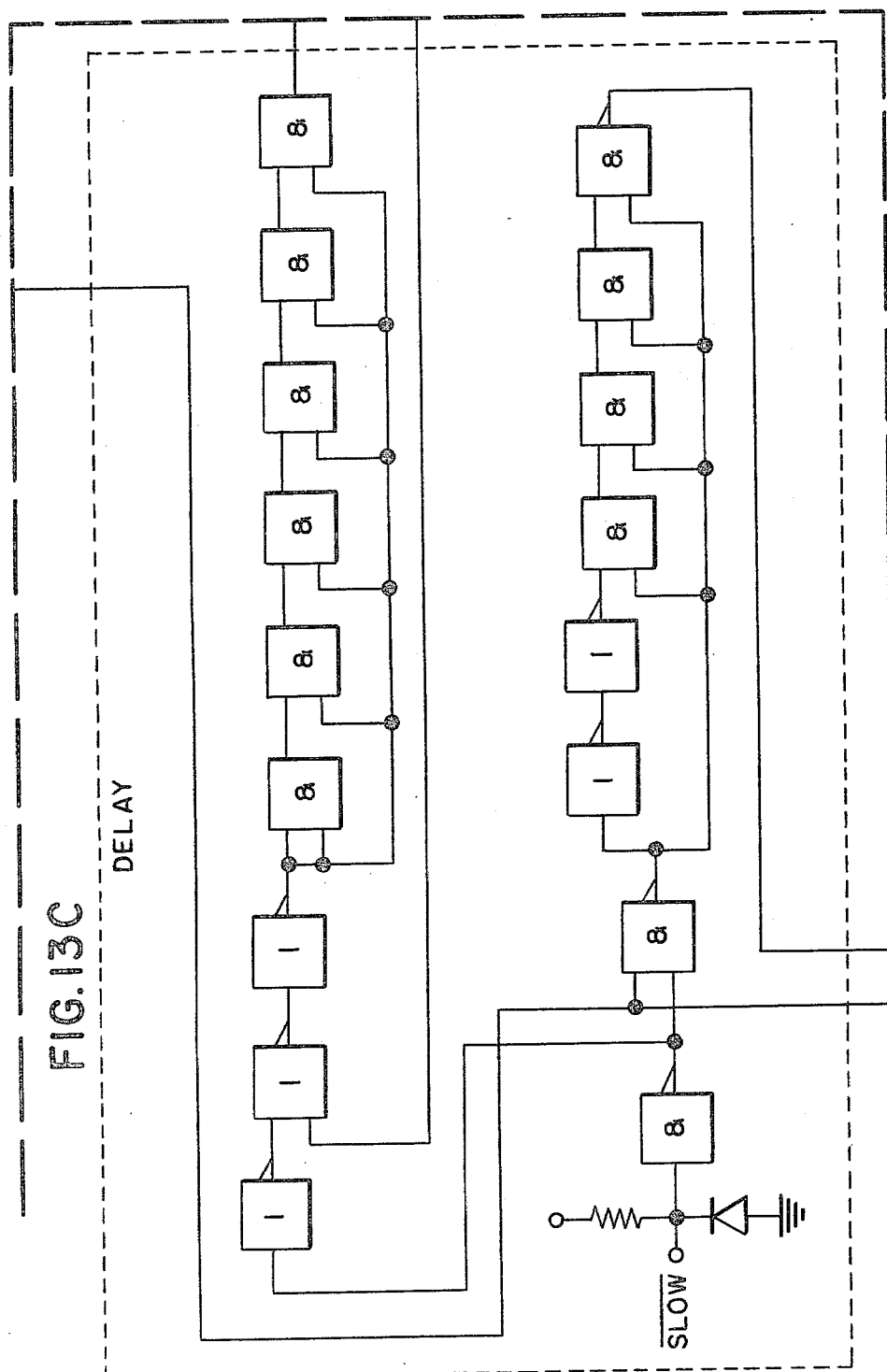

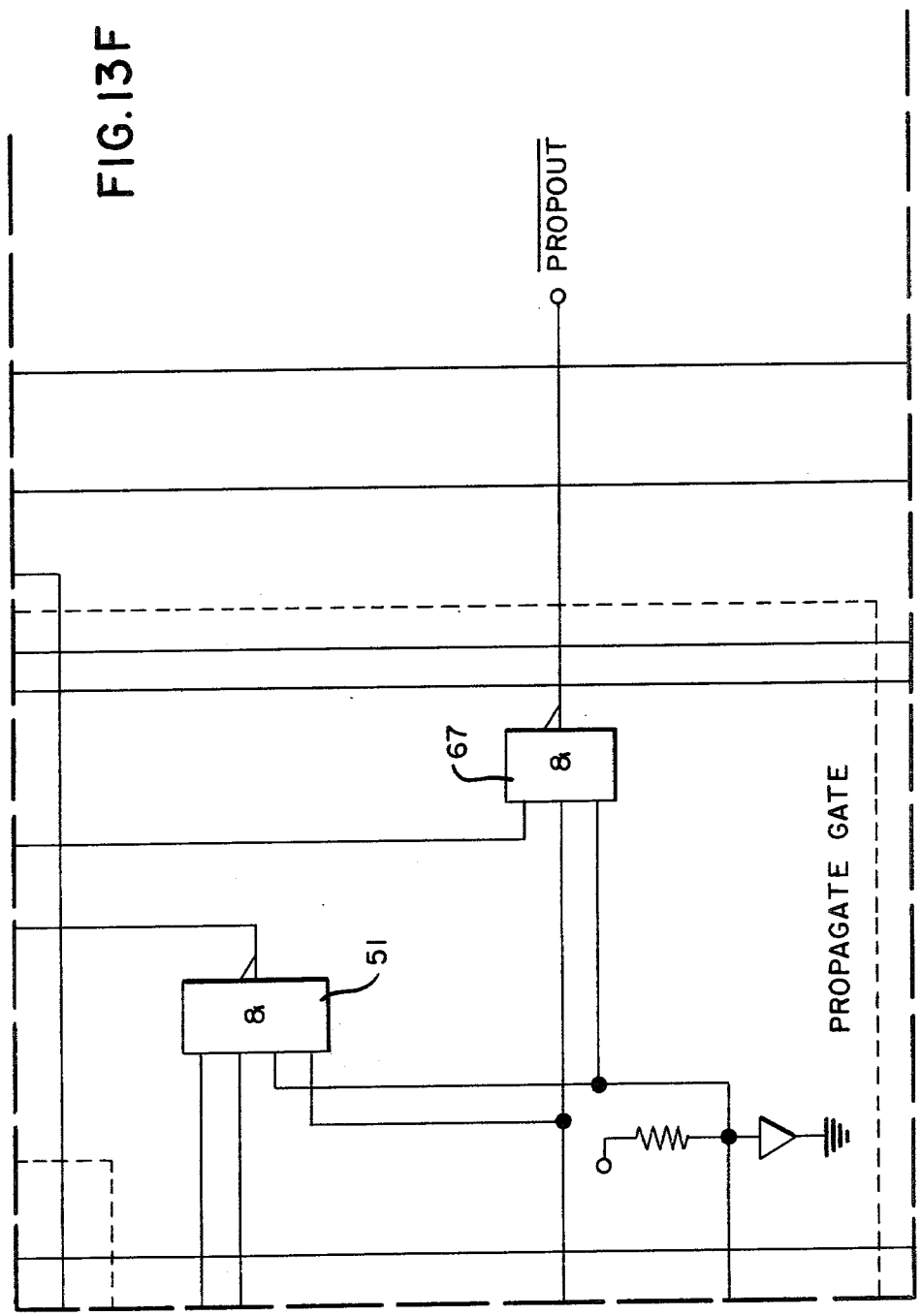

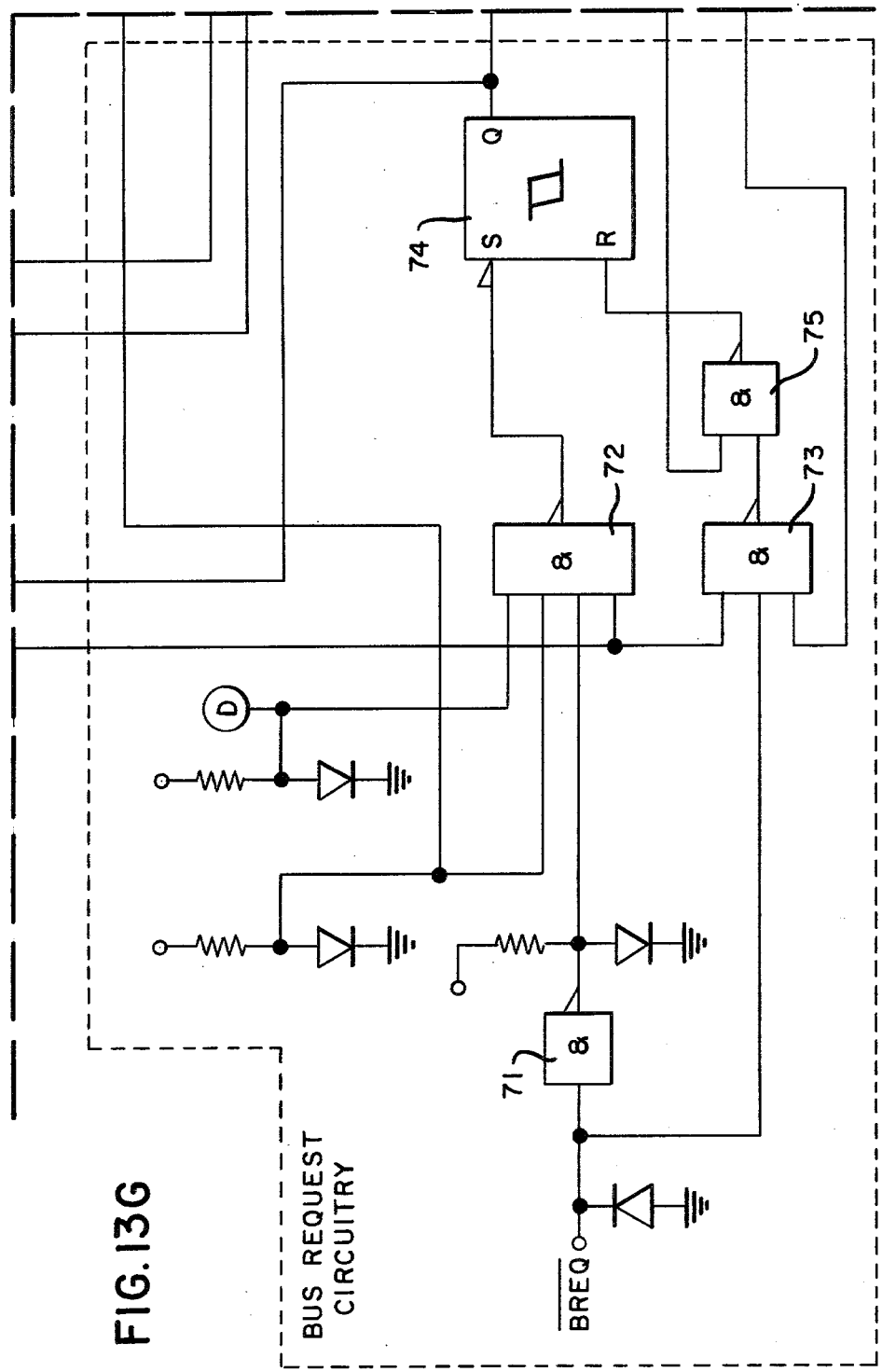

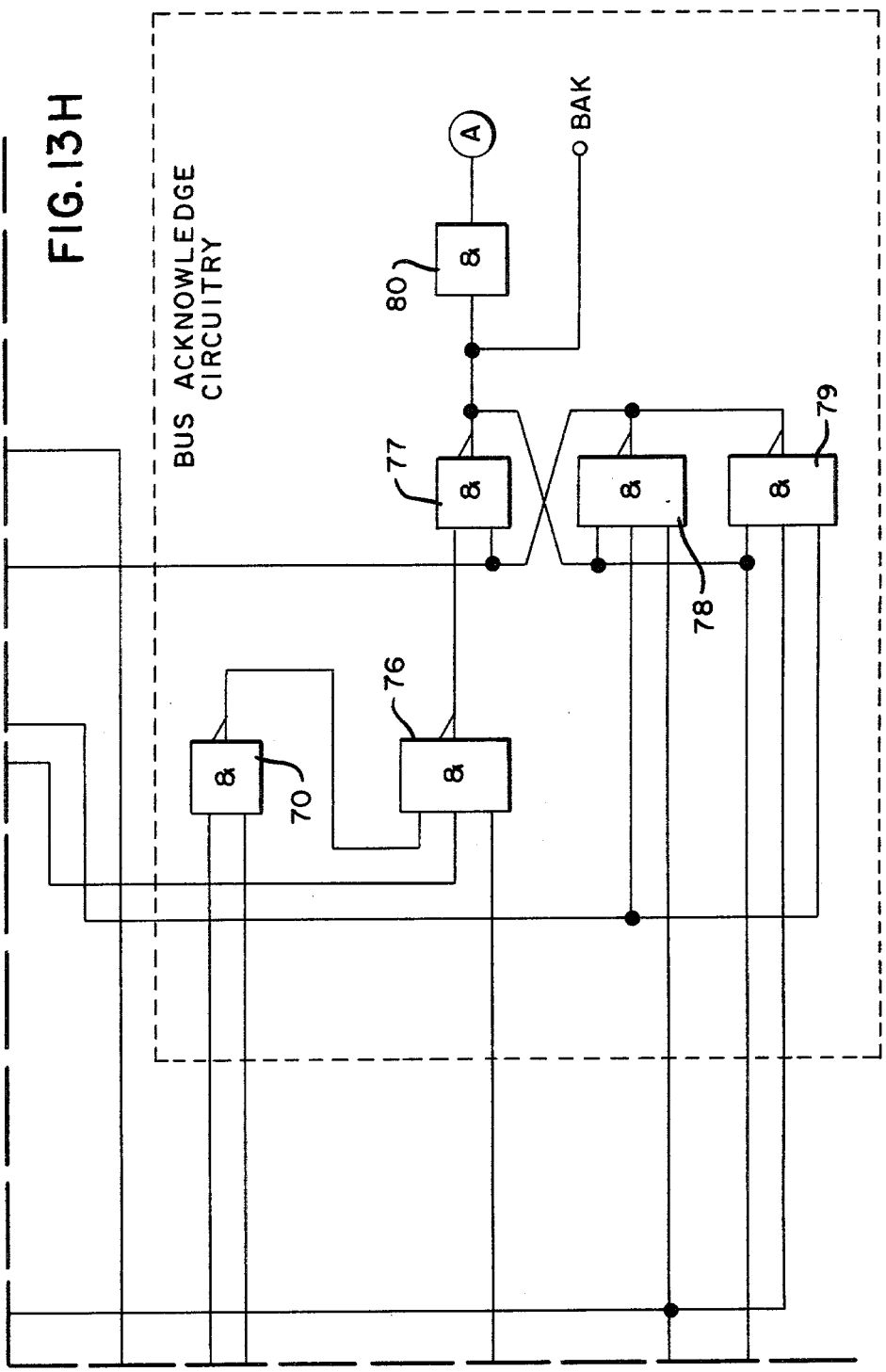

LATCHING SCHMITT TRIGGER CIRCUIT

BACKGROUND OF THE INVENTION

This invention relates, generally, to digital circuits and, in particular, to bistable circuits and their application in arbitration circuits.

Digital circuitry finds a variety of uses in digital computers and digital systems. Digital circuits which can be defined in one of two logic states can be used to indicate system-level-states, such as the occurrence/non-occurrence of an event, or the busy/ready status of a resource.

In asynchronous systems, various sub-systems must interact at times, e.g., a request for access to a bus or a memory access, and a decision as to which subsystem request occurs first or should be given priority must be made. To avoid system failures it is essential that the correct decision be made consistently and reliably. An error in the decision may result in allowing two peripheral units simultaneous access to a memory or simultaneous access to a system bus. Bistable circuits, used to indicate the system-level-status, must be in a definable logic state when they are interrogated in order to make a correct decision and to ensure reliable system operation.

In asynchronous systems, two asynchronous input signals occurring at the same time may result in a conflict, in which one signal is trying to set a bistable circuit and at the same time the other signal is trying to reset the bistable circuit. Another conflicting situation can occur when the two asynchronous input signals arrive at a gate simultaneously, one signal trying to pass through the gate and the other signal trying to inhibit the gate, resulting in a small pulse output, sometimes called a runt pulse. A pulse of this nature attempting to set a bistable circuit may not possess sufficient energy to effect the normal switching process of a bistable circuit. In such case, there is a finite probability that the bistable circuit switching may be slowed or delayed, or may oscillate in a metastable state. A metastable state is a state in which the device is indeterminate and may be oscillatory and has not reached the 1 or 0 logic state in a fixed time, the time generally being a normal time designed for the device.

In asynchronous system, synchronization techniques are implemented in an attempt to avoid erroneous decisions which can result in the problems mentioned above, mainly two sub-systems given access to a bus or allowed access to a memory sub-system. Present methods of synchronization utilize synchronizer circuits or networks consisting of a Schmitt trigger circuit with inertial delay elements, the inertial delay elements generally are discrete resistive and capacitive components, the capacitors being of significant value. A number of devices have attempted to minimize and/or eliminate the aforementioned problems. One particular device of interest is disclosed in U.S. Pat. No. 4,093,878 entitled "De-Glitchable Non-Metastable Flip-Flop Circuit". The circuit of the reference patent is comprised of a NAND gate and a Schmitt trigger NAND gate, which have the outputs cross-coupled back to each other's input in the standard configuration for forming a latch circuit. The junction of an RC integrator network is connected to an input of the latch circuit. The RC network tends to make the latch immune to small input signals and also immune to noise signals. The capacitor used in the RC network is of significant size. Another device of interest is disclosed in U.S. Pat. No. 3,983,496 entitled "Pulse Circuit". The circuit disclosed in this patent comprises a Schmitt trigger stage connected to a second stage to form a bistable feedback loop. An RC network is connected to the input of the Schmitt trigger circuit. The RC network in combination with an input gate acts as a pulse stretcher where short pulses are expected to be applied to the input terminal of the pulse circuit.

The circuit of the present invention is designed to eliminate the probability of entering a metastable state and is implemented using components available to LSI integrated circuit technology, which precludes the use of capacitors of any significant value.

SUMMARY OF THE INVENTION

The invention set forth and claimed herein comprises a bistable circuit in the form of a latching Schmitt trigger which is readily implemented in an integrated circuit and thus enables the implementation of a fast arbitration circuit as an integrated circuit.

The latching Schmitt trigger circuit of this inventin conceptually starts with a basic Schmitt trigger circuit which has an input and an output node. The basic Schmitt trigger circuit switches between a first and a second operating state as the voltage on the input node traverses the high and low threshold voltages of the circuit. An input circuit means, which is coupled to the input node of the basic Schmitt trigger circuit, includes a first bias circuit means and first and second control terminals adapted to receive first and second control signal sequences having prearranged respective logic level voltage values which function in cooperation with the first bias circuit means to establish the first and second operating states of the basic Schmitt trigger circuit as stable operating states, and to produce switching of the basic Schmitt trigger circuit between the stable operating states. In addition, a second bias circuit means is coupled to both the input and the output node for accelerating the switching of the basic Schmitt trigger circuit between the respective stable states in response to particular logic level voltage values in the control signal sequences, and for cooperating with the first bias circuit means to maintain the basic Schmitt trigger circuit in the respective stable states between switching with a high degree of noise immunity.

The several components, which are added to a basic Schmitt trigger circuit, permit the use of two inputs, each input capable of initiating a transition of the Schmitt trigger in only one direction. The additional components accomplish the latching feature by causing a threshold shift out of a range that would allow a return transition of the basic Schmitt trigger circuit once the set input has been removed. The additional circuit components also provide the noise immunity feature and also provide the circuit with a feedback path which accentuates the regenerative process. A resistor-diode network is provided which contributes to the biasing of the first transistor and also contributes to the noise immunity feature of the circuit. The second diode of the resistor-diode network is coupled from the junction of the resistor and first diode, to the collector of the second transistor, thereby contributing to the latching feature of the circuit by causing a shift in the input bias point and also contributing in the regenerative process making the circuit essentially immune to a metastable condition. The shifting of the threshold levels can be more easily seen in the following description of the circuit in conjunction with the description of the hysteresis of the circuit.

An arbitration circuit effectively utilizing the latching Schmitt trigger circuit set forth above, is provided. This arbitration circuit is adapted to be implemented as an integrated circuit which may be connected in a serial daisy chain of such arbitration circuits at the first and subsequent positions of the chain to resolve contentions for access to a common resource element among a plurality of devices. The arbitration circuit includes means defining a resource request signal period, a first interrogate signal period starting a preselected first time interval after the end of the resource request period, and a second interrogate signal period starting a preselected second time interval after the start of the first interrogate signal period, the second interrogate signal period being selectably defined only when the arbitration circuit is to be employed in the first position in the serial daisy chain. A request circuit means which includes a latch circuit operates during the resource request signal period to produce a latched resource request signal in response to a resource request signal from one of the devices. An interrogate gate is coupled to the output of the request circuit means and is operative during the first interrogate signal period to produce a propagate inhibit signal in response to a latched resource request signal. A propagate gate is coupled to the output of the interrogate gate and is operative during the second interrogate signal period for the first arbitration circuit of the serial daisy chain to propagate the second interrogate signal period to the next arbitration circuit and thereby defines a third interrogation signal period except when inhibited by the propagate inhibit signal. A request acknowledge circuit means, which includes a latch circuit, is coupled to the output of the request circuit means and is active during the second interrogate signal period to produce a latched resource acknowledge signal in response to a latched resource request signal.

The latch circuit in the request circuit means is the latching Schmitt trigger circuit described above. The fast, reliable switching characteristics of the circuit of the present invention is not susceptible to operating in a metastable condition, the circuit becomes especially useful in an arbitration circuit. An arbitration circuit is defined as a circuit which will achieve a "1" or "0" output in some time ($T_{max}$) with an arbitrary pulse input. Generally, a digital circuit which operates in either a logic 1 or logic 0 state, such as a flip-flop, that has a tendency to a metastable state, will ultimately reach a 1 or 0 output state. A circuit which tends toward metastability can be used in an arbitration circuit but the time, $T_{max}$, will be increased thereby slowing the system operation. If the wait is n-times the normal time of operation, such wait will cause a slowdown of the system operation in order to reduce the problem. If such wait is not incorporated into the system operation, the above mentioned problems have a probability of occurring, that is two devices having access to a common element.

The circuit of the present invention reaches a decision (reaches a logic 1 or logic 0 state) in a fast time thereby making its application in such an arbitration circuit highly desirable, without decreasing the system operation.

This integrated circuit version of an arbitration circuit provides a faster, lower cost alternative to prior arbitration circuits implemented with discrete bipolar components. Thus, the IC version enhances the operation of data processing systems which require implementation of an arbitration function.

From the foregoing it can be seen that it is a primary object of the present invention to provide a bistable multivibrator circuit with unidirectional inputs which is not susceptible to random noise inputs and which is immune to runt pulses.

It is another object of the present invention to provide a circuit with rapid switch times and which is immune from falling into a metastable state.

These and other objects of the present invention will become more apparent when taken in conjunction with the following description, application, and attached drawings, which drawings form a part of the present invention.

BRIEF DESCRIPTION OF THE DRAWINGS

FIGS. 6F and 6G show the hysteresis curves for the circuit of FIG. 5 and FIG. 3 respectively;

FIG. 8 is a functional system diagram of a serial arbitration chain utilizing the arbitration circuit;

FIGS. 13A-H are a composite logic diagram of the arbitration circuit in its complete implementation; and FIG. 14 indicates the manner in which FIGS. 13A-D are to be connected to form the complete logic diagram of the arbitration circuit.

DETAILED DESCRIPTION

The basic Schmitt trigger circuit 101, utilized within the invention described herein, can be best described with reference to FIGS. 1 and 2 and constitutes the prior art.

Figure 1:
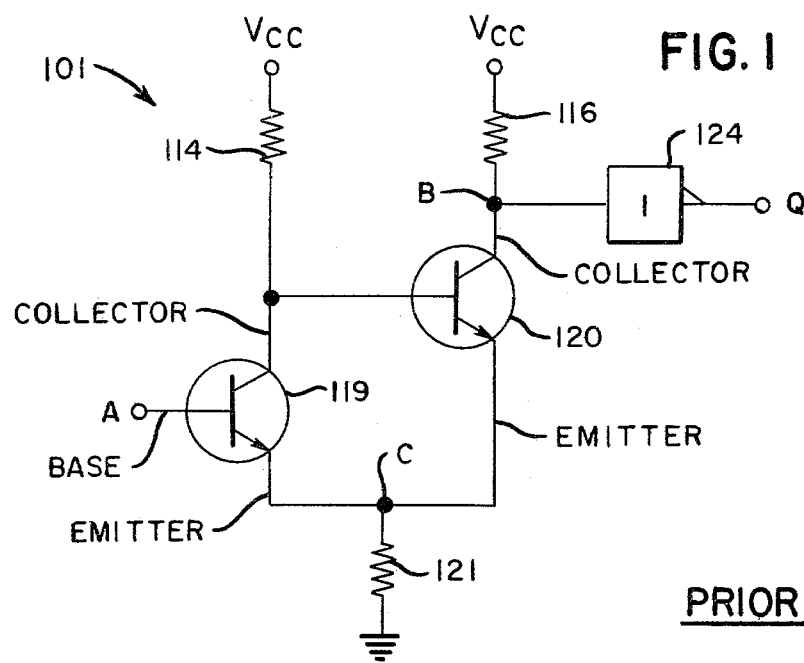
FIG. 1 is a schematic diagram of the basic Schmitt trigger circuit.
Figure 2A:
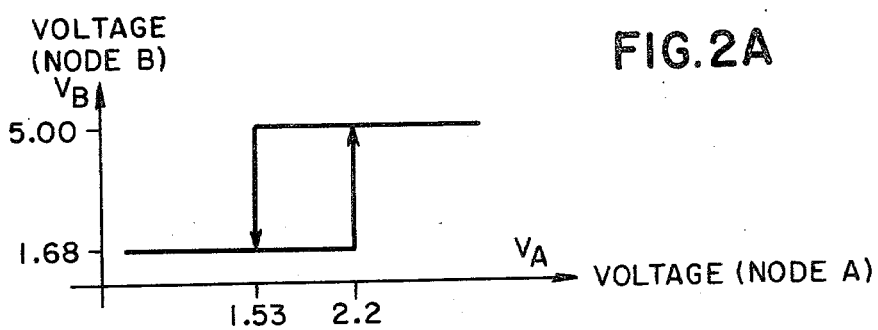
FIGS. 2A-2E show the waveforms of the circuit of FIG. 1 at the labelled nodes during a switching operation.
Figure 2B:
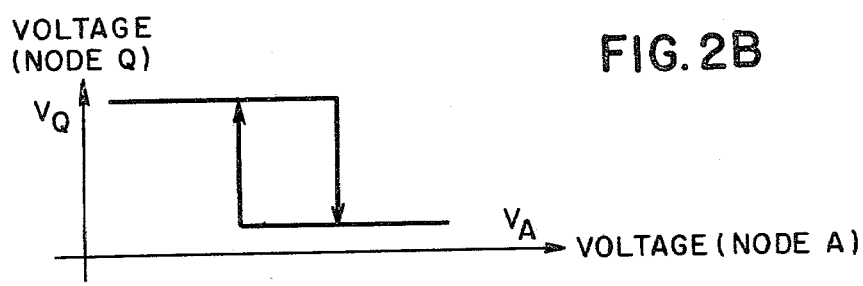
Figure 2C:
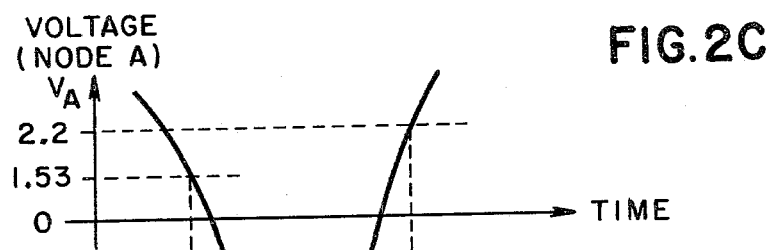

A Schmitt trigger circuit, like the circuit of FIG. 1, is a regenerative bistable circuit whose state depends on the amplitude of the input voltage. The input voltage is direct coupled to input node A and may have some waveform as shown in FIG. 2C. The output node B of the basic Schmitt trigger circuit 101 of FIG. 1 is coupled to a driver 124 in which the voltage at the output node Q is inverted from the voltage at the output node B as can be seen by comparing FIGS. 2D and 2E.

For illustrative purposes assume the following parameter values for the circuit of FIG. 1.

| Power supply voltage (power source, $V_{cc}$) | +5 volts |
|---|---|
| resistor 114 | 1.1K ohms |
| resistor 116 | 750 ohms |
| resistor 121 | 200 ohms |

Figure 2D:
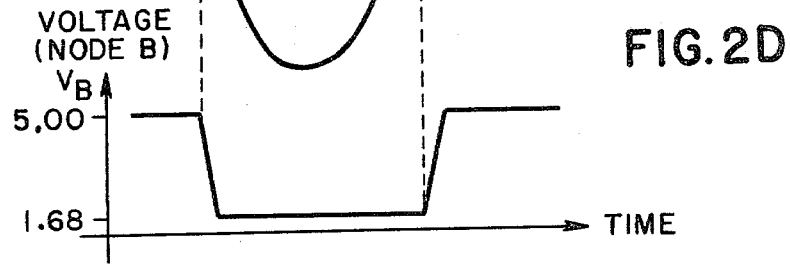
Figure 2E:
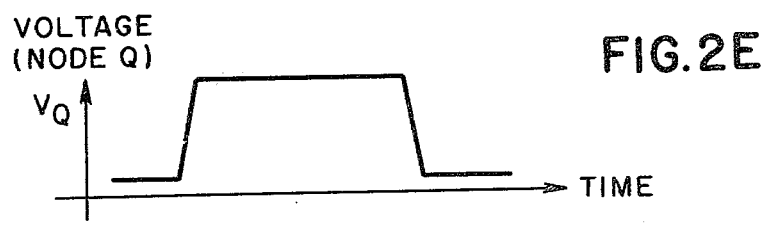

For an input voltage (voltage at node A, $V_A$)>2.28 V, transistor 119 would be in a saturated or ON state. (In saturated switching circuits, the ON state is marked by a very low collector voltage and a relatively large collector current, and the OFF state is marked by a relatively high collector voltage and a very small collector current.) The transistor 120 is held in the OFF state by the action of transistor 119. For voltages above 2.2 V, the voltage across resistor 121 essentially follows the input voltage. Hence for $V_A = +3$ v, the voltage across resistor 121 is approximately 2.2 v. The collector-emitter voltage of transistor 119 is very low ($\simeq 0.2$ v) which holds transistor 120 OFF. In the OFF state the collector current of transistor 120 is zero (hence, the current through resistor 116 is zero) resulting in the voltage at output node B ($V_B$) equals +5 V, as shown in FIG. 2D. The voltage, $V_Q$ is low as shown in FIG. 2E.

When the input voltage is reduced to 1.53 V (the voltage approximately equal to the voltage of the divider of resistor 114, and resistor 121), $+V_{be} = 0.8$ (approximately the forward bias voltage of the transistor base-emitter junction), and transistor 119 starts to come out of saturation but is still conducting hard and transistor 120 is still OFF. As $V_A$ decreases, even slightly from the 1.53 V threshold voltage level, the regenerative action starts to occur. The emitter voltage of transistor 119 will tend to decrease, tending to increase the collector voltage of transistor 119. This action tends to turn transistor 120 ON, tending to increase the emitter current from transistor 120. As the current through resistor 121 increases from transistor 120, the emitter voltage tends to increase, aiding in turning off transistor 119. This process continues until the circuits reach a second stable state in which transistor 119 is now OFF and transistor 120 is now ON. The second stable state is characterized by the output voltage at node B reaching a lower stable voltage level (FIG. 2D). The emitter voltage for both transistors 119 and 120 is approximately 1.40 V (the approximate voltage of the voltage divider action of resistor 114 in parallel with resistor 116, the parallel combination in series with resistor 121).

As long as the input voltage $V_A$ is less than or equal to (1.40+0.8) V, the second stable state will exist. When $V_A$ goes above (1.40+0.8) V, transistor 119 will start to conduct increasing the emitter voltage thereby reducing the collector voltage of transistor 119, which in turn will start to turn OFF transistor 120, reducing the emitter voltage and further reducing the collector voltage in a regenerative manner. The regenerative action will continue until the first stable state is reached. The hysteresis loops of the input and output voltages are shown in FIGS. 2A and 2B.

Figure 3:
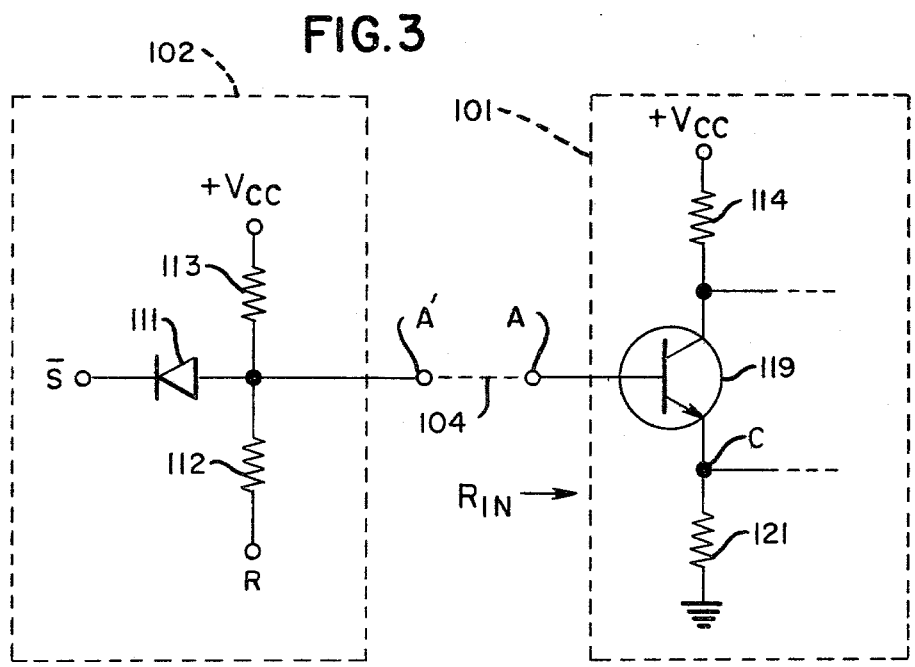
FIG. 3 is a schematic of the basic Schmitt trigger circuit made to operate as a latch by the addition of an input circuit.

By the addition of an input circuit 102 of the type shown in FIG. 3, the basic Schmitt trigger circuit 101 operates as a latch having a set and reset input.

Figure 4A:
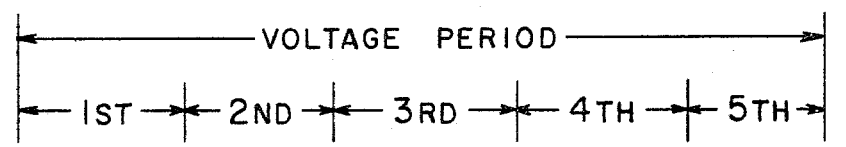
FIGS. 4A-4E show the waveforms of the circuit of FIG. 3.
Figure 4B:
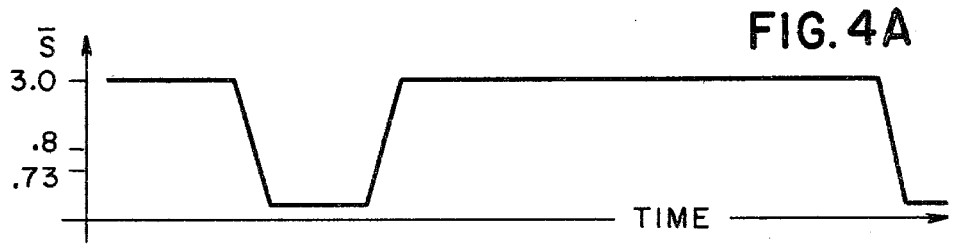
Figure 4C:
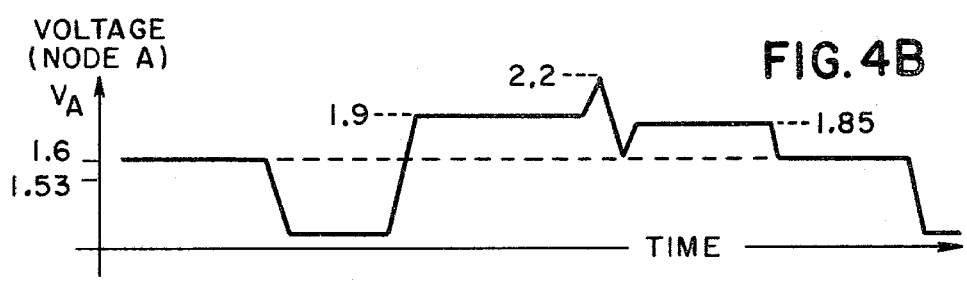

In order to operate properly as a latch, particular logic level voltage values must be established and, likewise, the control signal sequences must be established. For the circuit of FIG. 3, the set input is shown in FIG. 4A and the reset input is shown in FIG. 4E. A pulse of +3 volts is defined to switch the circuit between the respective stable states. Since an inverted pulse is required to set the circuit, the set input is labelled $\overline{S}$ (i.e. set bar) and will be utilized hereinafter.

For illustrative purposes assume the following parameter values for the input circuit 102 of FIG. 3:

| resistor 113 | 2.8K ohms |
|---|---|
| resistor 112 | 1.5K ohms |
| power source, Vcc | 5 volts |
| input signal $\overline{S}$, (initially) | 3 volts |
| input signal R, (initially) | .25 volts (nominally) |

Utilizing the above parameters, and making reference to FIG. 3, the voltage at node A' (i.e. before connecting input circuit 102 to basic Schmitt trigger circuit 101 with conductor 104) is 1.9 V. When input circuit 102 is connected to basic Schmitt trigger circuit 101 with conductor 104 ($V_{A'}$ is now equal to $V_A$ and initially conditioned to a reset condition), the loading caused by circuit 101 will cause $V_A$ to be clamped to a voltage slightly above 1.53 V (i.e., 1.6 V), hence biasing circuit 101 such that transistor 119 is ON and transistor 120 is OFF as described above. As long as $\overline{S}$ and R remain at their initial values (voltage period 1), the circuit of FIG. 3 will remain in the initial stable state. The equivalent noise margin is the difference between the unclamped reference voltage and the threshold (1.9 V and 1.53 V, respectively).

When $\overline{S}$ is decreased to 0.73 V, diode 111 starts to conduct and voltage $V_A$ starts to follow $\overline{S}$. When voltage $V_A$ reaches 1.53 V, the regenerative action of the basic Schmitt trigger circuit 101 of FIG. 3 will occur as described above. With transistor 120 ON, the voltage at output node B will be lowered to 1.68 volts from its initial value of 5 volts, the lowered voltage representative of a second stable state (or set state, voltage period 2).

Figure 4D:
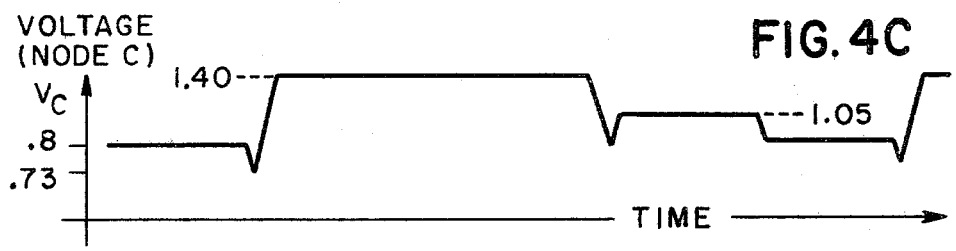
Figure 4E:
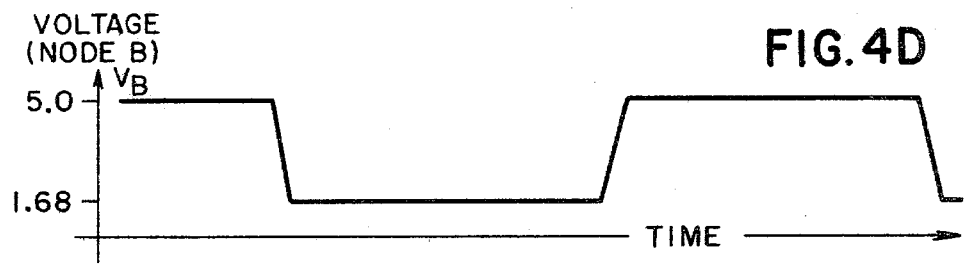

When $\overline{S}$ returns to +3 volts (FIG. 4A), the circuit will remain in the set state (FIG. 4D, voltage period 3). This is due to the action of input circuit 102 interacting with circuit 101. As described above, the voltage at node C, emitter voltage $V_C$ (see FIG. 4C), increases to 1.40 V. Since transistor 119 is off, the loading effect of circuit 101 is not operative on input circuit 102, thereby raising the voltage at node A to 1.9 volts. This bias voltage operates to hold transistor 119 OFF, thereby holding the circuit 101 in the second (set) stable state. Also since $\overline{S}$ is $>V_A$, diode D1 is non-conducting, thereby decoupling input node A from control terminal $\overline{S}$. As long as control signals $\overline{S}$ and R remain at their respective voltages the circuit 101, the circuit having been set, will remain thus.

Referring now to FIG. 4, voltage period 4, as control signal R increases, input voltage $V_A$ will increase. When R reaches approximately 0.65 volts, $V_A$ reaches the threshold voltage of 2.2 volts, which will then cause transistor 119 to turn ON, and the circuit 101 to switch to the initial (or reset) stable state as described above. When control signal R returns to its initial value (voltage period 5), input circuit 102 will maintain the bias voltage for transistor 119 to maintain the ON condition. Transistor 120 will be OFF, i.e. the collector current will be zero, and the voltage at node B will remain at 5 volts, defined as the reset state. The output of driver 124, node Q, will be low relative to the voltage for the set state. Thus, output voltage $V_Q$ will reflect the state of circuit 101 consistent with positive logic definitions.

The hysteresis curve for the circuit of FIG. 3, shown in FIG. 6G, shows the input voltage (1.56 volts) residing at a voltage close to the lower threshold voltage (1.53 volts) of the circuit 101. The equivalent noise immunity is the difference between the reference voltage (1.9 V) and the lower threshold (1.53 V). This characteristic makes the circuit more susceptible to input noise than a circuit in which the input reference voltage is much higher than the lower threshold voltage. Also, for the circuit of FIG. 3 to prevent erroneous switching, parameter tolerances must be more closely maintained (hence impractical for IC) and the parameter values must not be susceptible to large variations over an operating temperature range.

Figure 5:
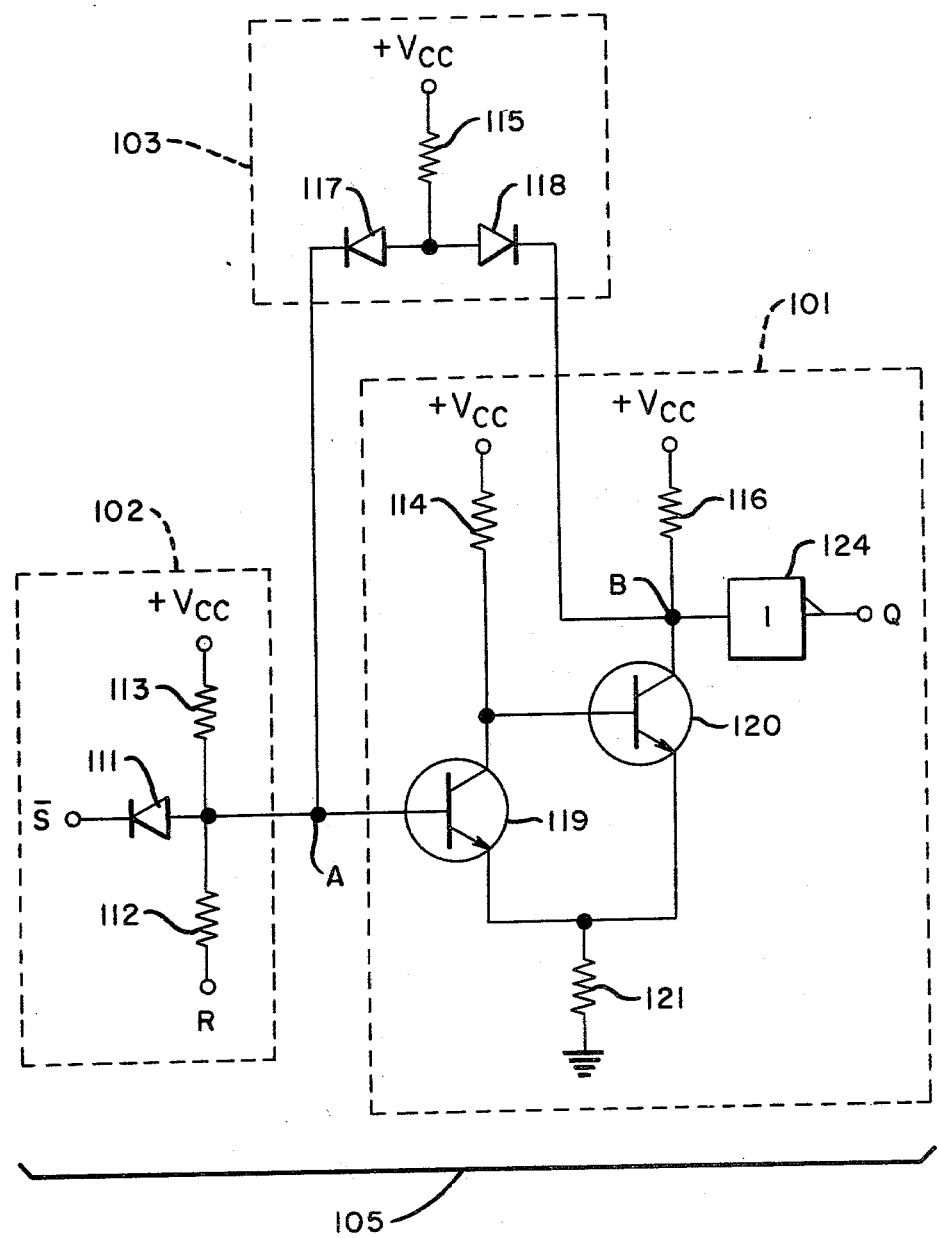
FIG. 5 is a schematic of the latch circuit of FIG. 3 with the addition of the second bias circuit.

In order to assist in minimizing or overcoming the problems of the above described latch circuit, a second bias circuit 103 is added to the latch circuit of FIG. 3 and is shown in FIG. 5.

Again, for illustrative purposes, assume the power source, $V_{cc}$, is +5 volts, resistor 115 is 1.0 K ohm, and resistor 112 is lowered to 1.2 K ohm. With the circuit 105 of FIG. 5, in its initial or reset state (voltage period 1), diode 117 will be conducting and diode 118 will be non-conducting. The current contribution by the second bias circuit 103, flowing through resistor 115, will increase the base current of transistor 119, driving it ON harder. Also, the input voltage at node A will increase to 1.9 volts.

Figure 6A:
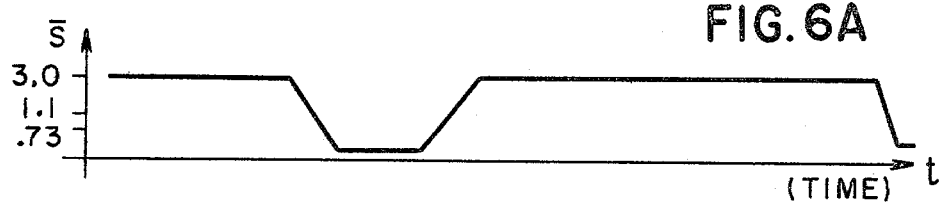
FIG. 6A-6E shows the waveforms of the circuit of FIG. 5 at the labelled nodes in response to the set and reset control signals sequences.
Figure 6B:
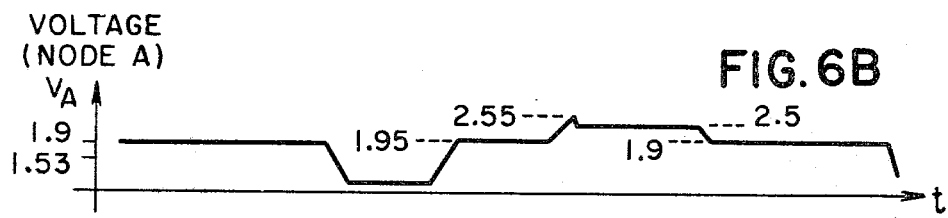
Figure 6C:
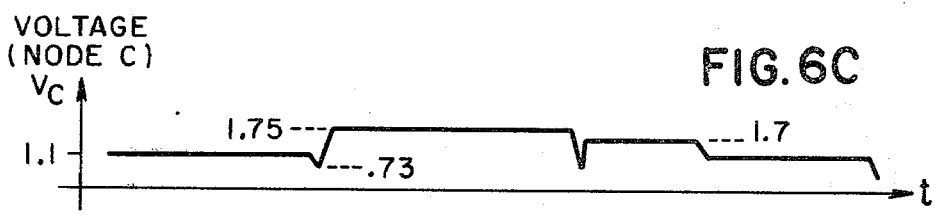
Figure 6D:
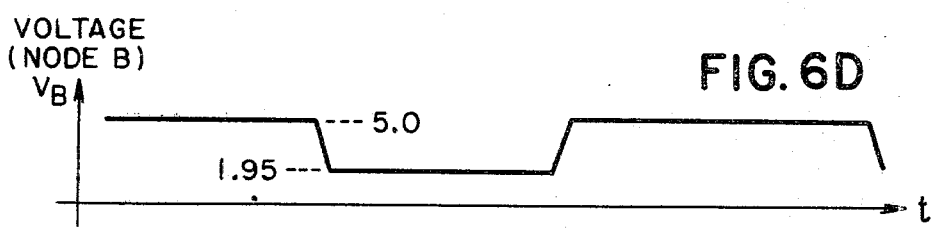
Figure 6E:
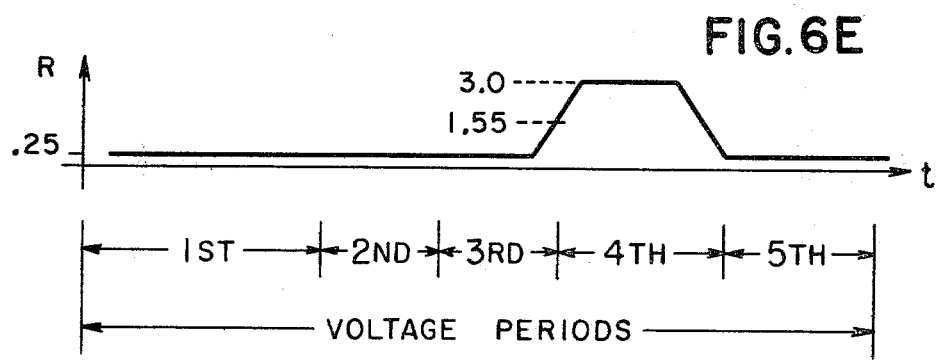

Except for the increased voltages at the input, the remainder of the circuit behaves like the above-described latch circuit during voltage period 1. Diode 111 again decouples the input control signal S from the input voltage node A. Circuit 105 will remain in this initial (or reset state) for the control signals $\overline{S}$ and R at 3 volts and 0.25 volts respectively, as shown in FIGS. 6A and 6F. Referring to FIG. 6F, and comparing to FIG. 6G, the noise margin improvement is more readily apparent by the shift of the input reference voltage to the 1.9 volt actual value and 2.7 effective value.

As control signal $\overline{S}$ decreases, voltage $V_A$ follows $\overline{S}$ once diode 111 conducts. When $V_A$ reaches 1.53 volts the regenerative action described above begins to take place. In addition, as a result of the collector voltage of transistor 120 decreasing, diode 118 starts to conduct diverting the current from diode 117. This action tends to increase the turning OFF of transistor 119 and the turning ON of transistor 120. The increase in current from diode 118 causes the emitter voltage $V_c$ to increase to 1.75 volts, thereby increasing the upper threshold voltage.

When control signal $\overline{S}$ returns to +3 volts (voltage period 3 of FIG. 6A-E), the combined input and feedback circuits maintain the voltage at input node A at 1.95, since diode 117 is partially conducting and transistor 119 is OFF. Referring to FIG. 6F, and comparing to FIG. 6G, the improvement in the noise tolerance is readily seen. The voltage at output node B is held at 1.95 volts and represents the second stable state (set state) of the circuit 105. The circuit 105 remains in this state until reset by the reset control signal.

When the reset control signal, R, is applied, the voltage level increases. When input voltage $V_A = 2.55$ volts, the upper threshold voltage, transistor 119 starts to conduct and turn ON, and transistor 120 starts to turn OFF. The regenerative action described for the circuit of FIG. 3 begins. In addition, diode 117 starts to conduct and diode 118 begins to turn off aiding in the regenerative process thereby causing the switching of circuit 105 to be increased until the circuit 105 reaches the reset state (voltage period 4).

After the reset control signal, R returns to its initial value, the circuit 105 remains in the initial stable state (voltage period 5) with the input circuit 102 and the second bias 103 maintaining the input voltage at node A at 1.9 volts, thereby holding transistor 119 ON. With transistor 120 OFF, the output voltage at node B is back to +5 volts, the voltage value defined as the logic zero level or the reset state.

The addition of the second bias circuit 103 causes a greater voltage difference between the threshold voltage and the voltage reference point. The resultant circuit thereby exhibits greater stability, greater immunity to noise and allows an integrated version to operate reliably with voltage, temperature, and component variations.

The resistor values and voltage values presented here are intended as representative of the shifts of threshold and bias points. Variations of these values can be made to alter threshold values, hysteresis values, or bias point voltages still maintaining the advantages of the invention described above.

Figure 7:
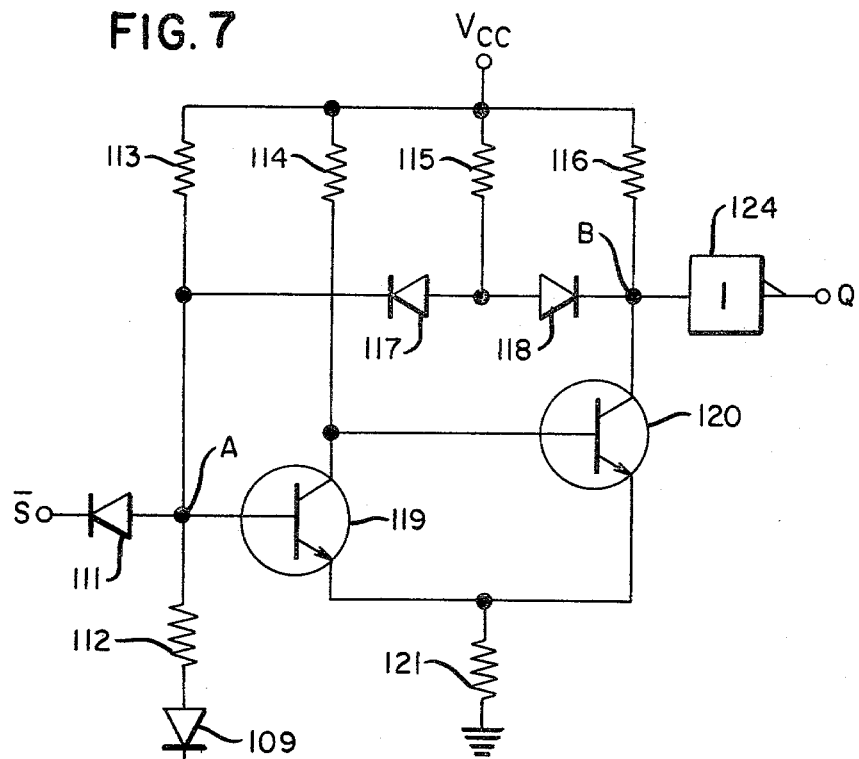
FIG. 7 shows an alternative embodiment of the latching Schmitt trigger circuit.
Figure 7A:
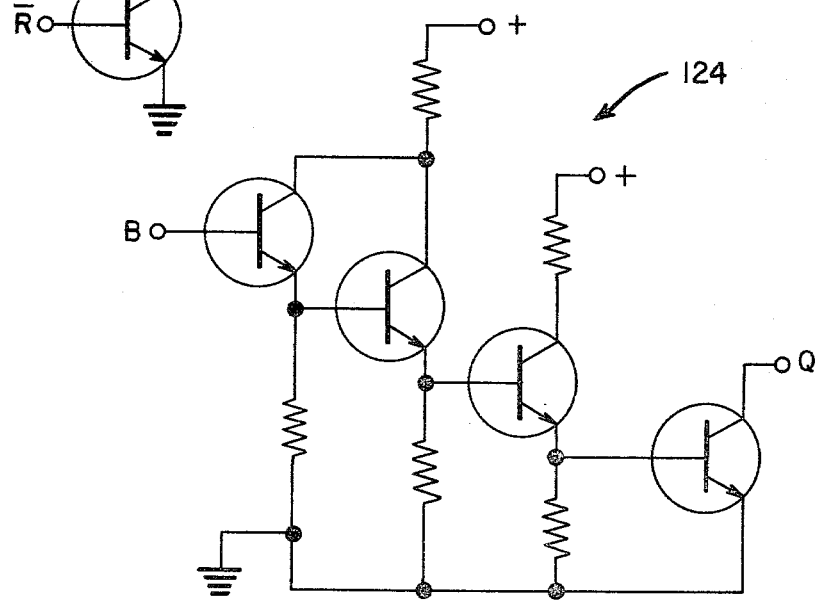
FIG. 7A shows a circuit diagram of the output driver of the latching Schmitt trigger circuit.

An alternative embodiment of the latching Schmitt trigger circuit is shown in FIG. 7. The circuit is essentially the same as that described above. The addition of diode 109 tends to provide voltage tracking with temperature of the lower threshold resistor divider bias level. FIG. 7A is a circuit diagram of the output driver 124 of the latching Schmitt trigger circuit 105.

The latching Schmitt trigger circuit is utilized in the TTL compatible bus arbitration circuit which finds application on bus master modules for resolving contention between potential bus masters which simultaneously request bus access. Bus arbitration is implemented in a serial daisy-chain technique which assigns master priority relative to the master module's physical position within the chain. Referring to FIG. 8, the leftmost master module in the chain is designated as highest priority by the FIRST/LAST connections, with masters to the right having successively lower priority. Each bus master contains a bus arbitration circuit (plus additional logic circuitry, interface, timing, ...) which is connected to the serial arbitration chain. An external device may request bus access through its bus master and will be acknowledged by the arbitration circuit when the bus has been acquired. The external device may request bus access ($\overline{BREQ}$) at any time. The internal bus arbitrator will accept $\overline{BREQ}$ only during the resource request period ($\overline{BUSY}$ is low, low denoting a logic zero and high denoting a logic one for positive logic). The arbitrator inhibits $\overline{BREQ}$ and enables the serial arbitration chain when $\overline{BUSY}$ is high (or transfer complete (COMP) is high) thereby initiating the interrogation process (the system interrogation period).

If the Bus Master has a pending active $\overline{BREQ}$, the arbitrator will inhibit the $\overline{PROP\ OUT}$ signal to the next master and will receive the $\overline{PROP\ IN}$ signal. The arbitrator then activates the bus acknowledge (BAK) and $\overline{BUSY}$ signals. If no active BREQ is pending, the arbitrator passes the $\overline{PROPIN}$ signal to the $\overline{PROPOUT}$ output. This signal is passed down the chain until propagation is inhibited by bus access or until the signal reaches the end of the chain. In either case, the chain is reset, and new bus requests are accepted when $\overline{BUSY}$ is low.

Figure 9:
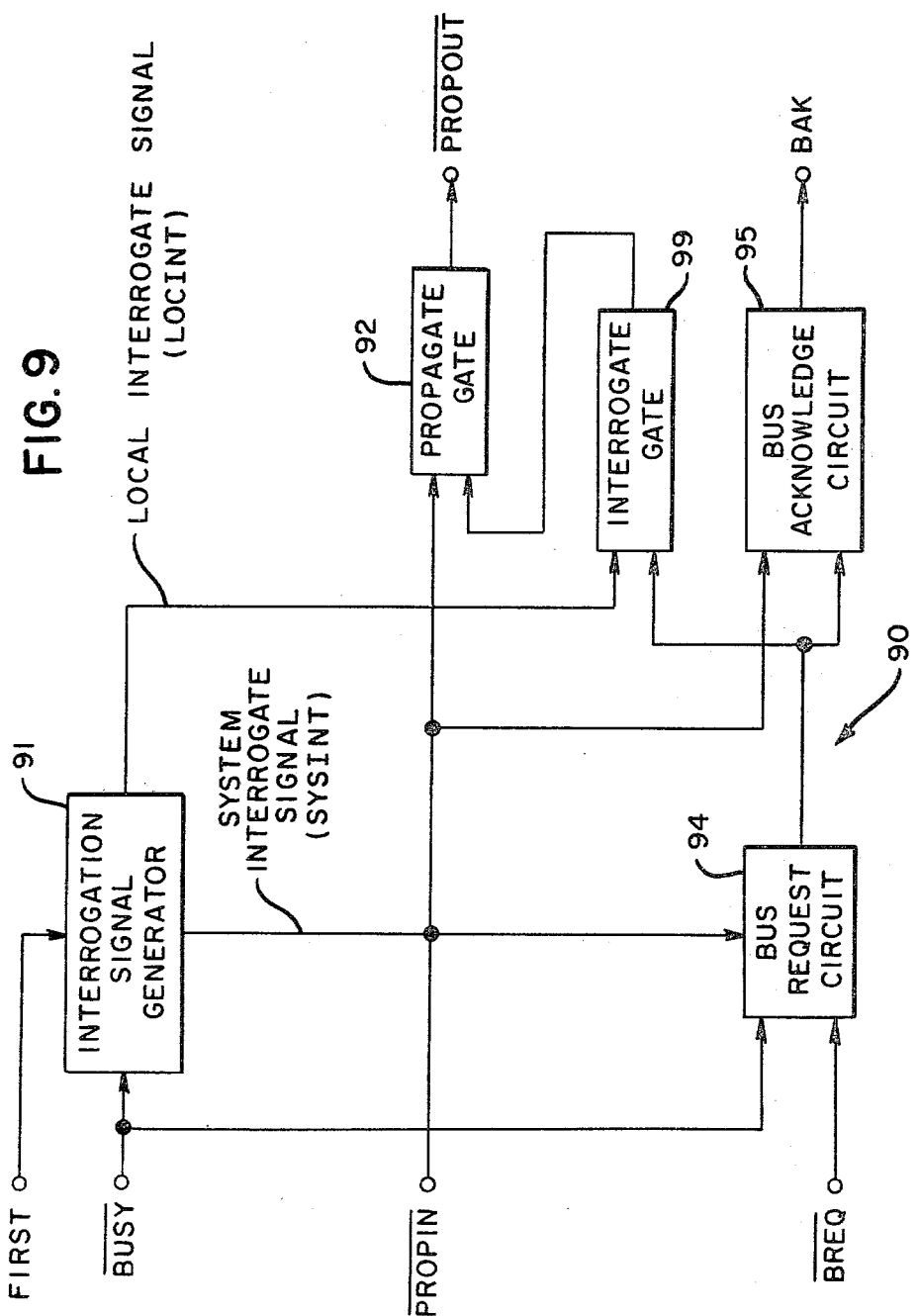
FIG. 9 shows a general block diagram of the arbitrator circuit.

FIG. 9 shows a general block diagram of the bus arbitration circuit. The principal blocks consist of:
1. Bus Request Circuit (94)
2. Bus Acknowledge Circuit (95)
3. Interrogation Signal Generator (91)
4. Interrogate Gate (99)
5. Propagation Gate (92)

In the operation of a digital system, based upon some predetermined criteria, a determination is made to poll the bus masters in order to ascertain if a request for bus access has been made. The system initiates the polling, or interrogation process, by the operation of a system command signal, $\overline{BUSY}$ goes high. This causes every bus master (or bus arbitration circuit) to generate the local interrogate signal from the interrogation signal generator 91 logic and partially enable interrogate gate 99.

The local interrogate signal is generated by the driver portion of the interrogation signal generator 91 (FIG. 10), which includes a latching Schmitt trigger circuit 20. When $\overline{BUSY}$ goes high, the output of driver 64 goes low, and output of NAND gates 22 and 23 goes high, causing output of driver 21 to go low. The output of the latching Schmitt trigger circuit 20 goes high partialy enabling AND gate 19. The second input to AND gate 19 is high as a result of NAND gates 22 and 23 being high, thereby totally qualifying AND gate 19 resulting in the output of AND gate 19 being high. NAND gate 18 has both inputs high, resulting in output of NAND gate 18 going low delayed from the $\overline{BUSY}$ signal.

Figure 10:
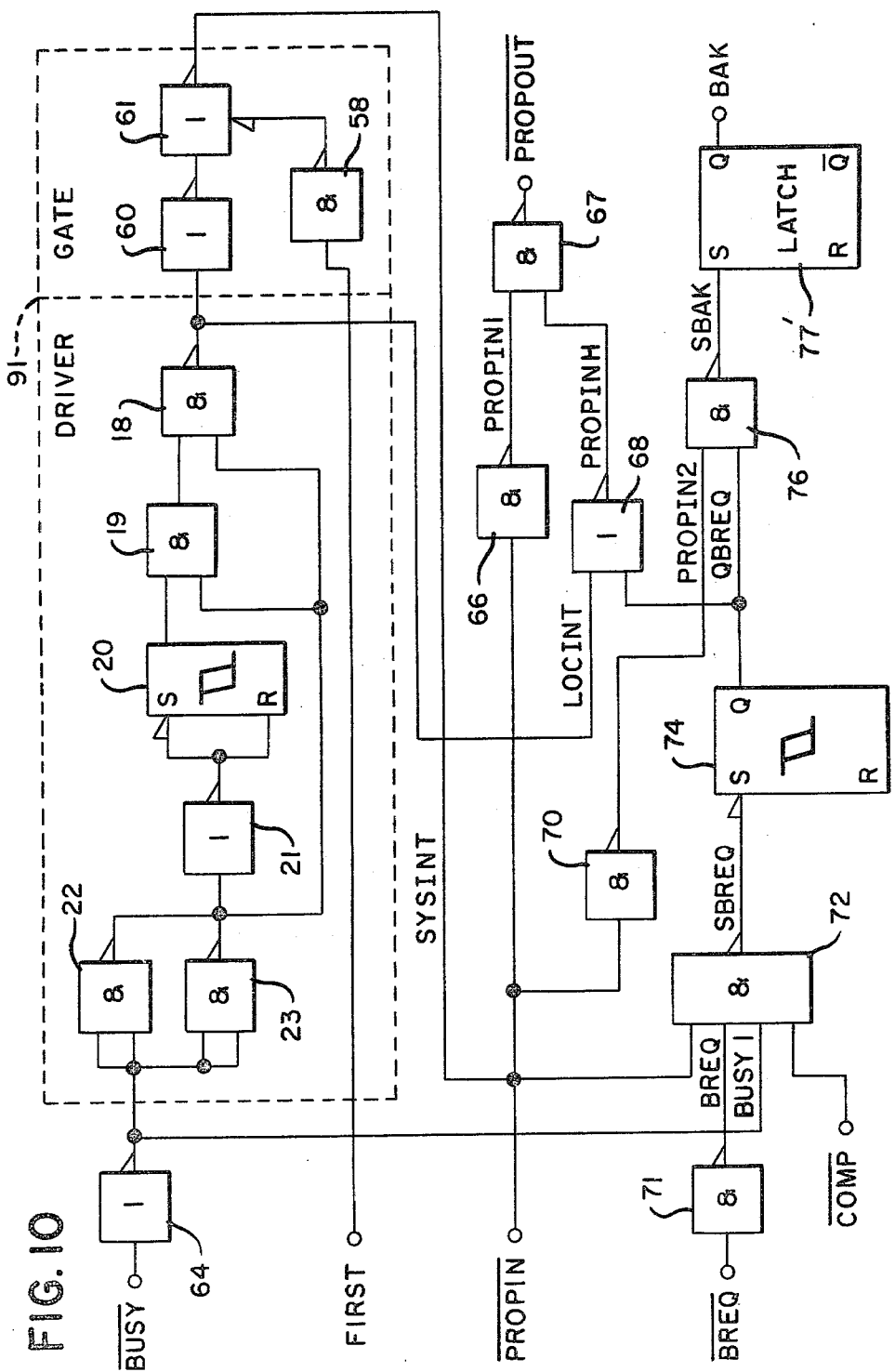
FIG. 10 is a logic diagram of the arbitrator circuit.
Figure 11:
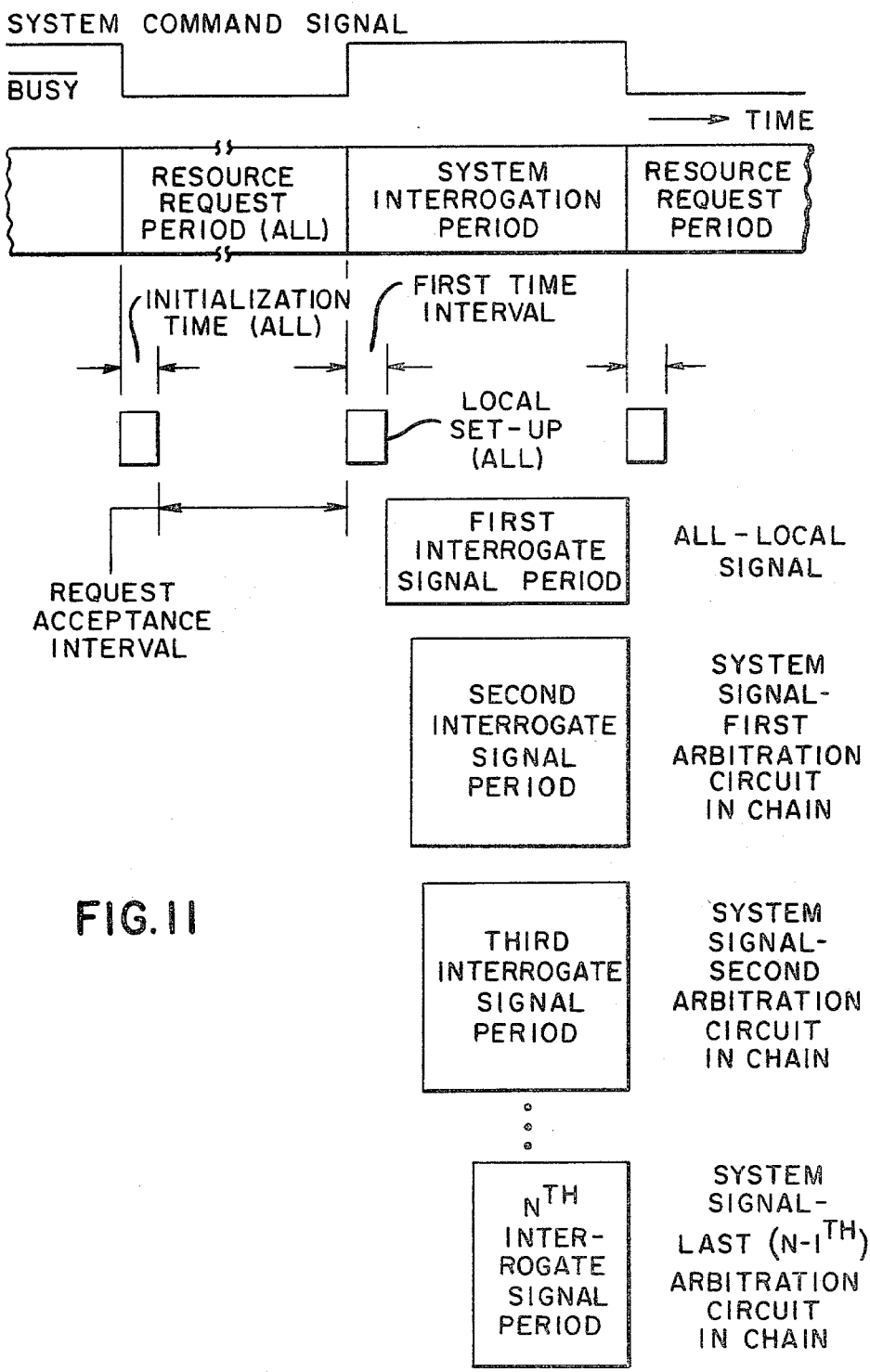
FIG. 11 is a timing diagram of the functional time periods of the arbitration circuit of FIG. 10.

The time sequence of the operation of the arbitrator circuits can be described from FIG. 11. When $\overline{BUSY}$ is low, a time period (Resource Request period) is defined during which time the arbitrator circuits may accept a bus request, except for a small interval of time at the beginning of the Resource Request period in which the circuitry is initialized after the interrogation sequence. When $\overline{BUSY}$ is high, the arbitrator circuits inhibit the bus request signal and defines the System Interrogation period. (The two time periods are determined by system operation, the respective time periods not necessarily being drawn to scale in the Figures.) The delay between $\overline{BUSY}$ going high and the generation of the local interrogate signal is depicted in FIG. 11 as the first time interval and allows for the local circuits to set up the logic for interrogation and also allows for the generation of the local interrogate signal. The local interrogate signal, which partially enables interrogate gate 68 (FIG. 10), corresponds to the first interrogate signal period and is applicable to all the arbitrator circuits in the chain. The second and subsequent signal periods correspond to the serial nature in which the system interrogate signal (in a bus request application as described here the signal is sometimes referred to herein as a system bus request interrogate signal) operates to interrogate each arbitration circuit in turn starting with the first arbitrator circuit, i.e. the highest priority circuit. If no bus request is pending, the $\overline{PROPOUT}$ signal is propagated through Prop Gate 92 and becomes the $\overline{PROPIN}$ signal for the next arbitration circuit in the chain therby corresponding to the next interrogate signal period. The process continues in a serial fashion until all the arbitration circuits in the chain have been interrogated or until a pending bus request is detected.

The first arbitrator circuit 90A of the serial arbitration chain in FIG. 8 has the FIRST terminal unconnected and the LAST terminal connected to ground potential. The output of the driver portion of the interrogation signal generator 91 (gate 18 of FIG. 10), is inputted to driver 60 and then to driver 61. Driver 61 is enabled by gate 58, only for the first arbitration circuit 90A. Also, for the first arbitration circuit 90A, $\overline{PROPIN}$ is not connected since the system interrogation signal is internally generated. All subsequent arbitration circuits 90B, . . . , 90C, have the FIRST terminal connected to ground potential disabling driver 61. Each intermediate arbitration circuit has its $\overline{PROPIN}$ terminal connected to the prior arbitration circuit $\overline{PROPOUT}$ terminal thereby receiving the system interrogation signal from the prior arbitrator circuit effecting a serial (or sequential) polling (or interrogation) of each arbitrator circuit 90. The system interrogation signal is propagated through the propagation gate 92 of each arbitration circuit 90 if no bus request has been detected or if the last arbitrator circuit has not been encountered. The propagation gate 92 must inhibit the system interrogation signal from propagating to other arbitration circuits in the serial arbitration chain if a bus request has been detected. Also, the bus request latch 74 must be in a stable state, i.e. not in a metastable state, at the time it is being interrogated. Otherwise, the problem in which two devices having simultaneous access to the bus may occur.

Referring to FIG. 12, the operation of the circuit of FIG. 10 will be described. The waveforms of FIG. 12 include the relative gate delay times. Since the interrogation is performed in sequence, only the waveforms for the first arbitrator circuit are shown. Also, the decision process performed by the arbitrator circuit is most critical for the first circuit. The operation for the intermediate arbitrator circuits are briefly discussed. Since the decision process involves the setting action of the latching Schmitt trigger circuit 74, the setting process is described in detail with the aid of the waveforms of FIG. 12. The resetting of the arbitrator circuits is not time critical and is described below in some detail through the interaction of the arbitrator circuit with the system command signals.

Figure 12A:
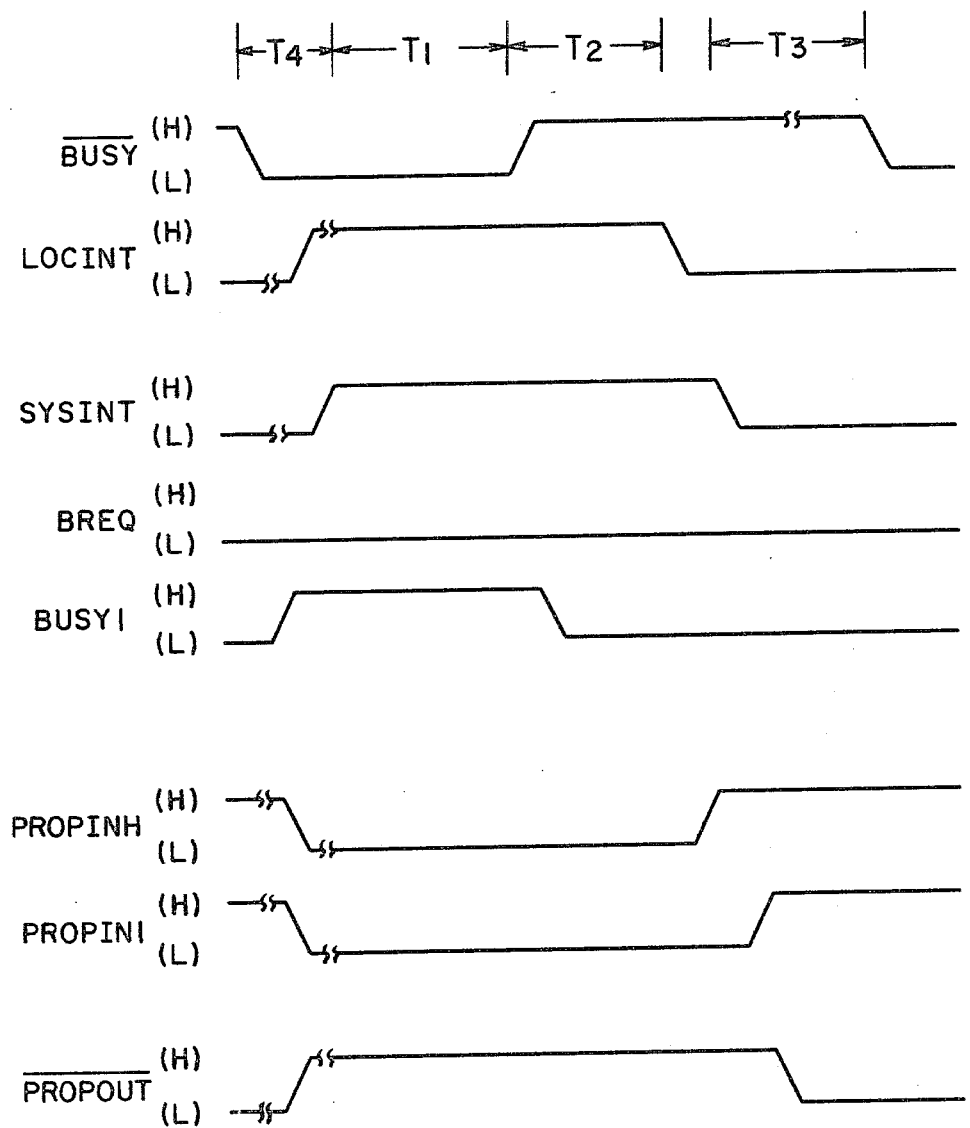
FIGS. 12A-12D show the waveforms of the arbitrator circuit of FIG. 10 in response to time varying bus request signals.

Referring to FIGS. 10 and 12A, the waveforms of the first arbitrator circuit 90A in a serial arbitrator chain are shown assuming no bus request is pending during the system interrogation period.

When $\overline{BUSY}$ goes low, the resource request period starts. During time period $T_1$ (request acceptance interval), the arbitrator circuits can accept a bus request. (During time period $T_4$, the circuitry is initialized after the interrogation sequence. NAND gate 72 is not qualified until SYSINT goes high, BUSY1 partly qualifying NAND gate 72 by going high shortly after $\overline{BUSY}$ goes low.) Since no bus request has been made, $\overline{BREQ}$ remains high and the output of gate 71 (BREQ), which is one of the inputs to NAND gate 72, remains low. The system interrogation signal (SYSINT) input to NAND gate 72 is also high during time $T_1$. Since no bus request is present and the input busy signal (BUSY1) to gate 72 is high, the output of NAND gate 72 ($\overline{SBREQ}$) is high leaving latching Schmitt trigger circuit 74 reset, i.e. output Q (QBREQ)is low, partially qualifying NOR gate 68.

When system command signal $\overline{BUSY}$ goes high, the interrogation process of the serial arbitation chain is started. The local interrogate signal (LOCINT) is generated by all the arbitrator circuits 90 in the serial arbitration chain, totally enabling NOR gate 68 (PROPINH). The generation of the system interrogate signal (SYSINT) from the $\overline{BUSY}$ signal has been described above and occurs for the first arbitrator circuit only. The busy input (BUSY1) to NAND gate 72 going low, which occurs for all the arbitration circuits in the chain at the same time, inhibits any bus requests from being accepted during the system interrogation period. The system interrogation signal, which becomes $\overline{PROPIN}$ for the first arbitration circuit, propagates through gate 66 (PROPIN1). NAND gate 67 is totally qualified propagating $\overline{PROPOUT}$ to the next arbitrator circuit in the chain which becomes the system interrogation signal for that arbitrator circuit. Since no bus request was present, the bus acknowledge signal BAK remains low and $\overline{BUSY}$ remains high through the system interrogation period. The propagation continues until NAND gate 67 is disabled by the LAST connection. For the last arbitrator circuit 90C, LAST is not connected, resulting in a high input. The LAST input is inverted twice through gates 29 and 50 (see FIG. 13) resulting in a high input to NAND gate 51. When the system interrogation signal PROPIN is received by arbitration circuit 90C, the output of gate 66 (PROPIN1) is high, and the output of NOR gate 68 (PROPINH) is high from the local interrogation signal. NAND gate 51 output therefore goes low forcing the output of NAND gate 53 high which in turn causes $\overline{BUSY}$ to be forced low by the action of driver 55. $\overline{BUSY}$ going low terminates the system interrogation period (the time period beginning with T2 and ending with T3). T2 corresponds to the first time interval of FIG. 11 and T3 corresponds to the first interrogate signal period.

Figure 12B:
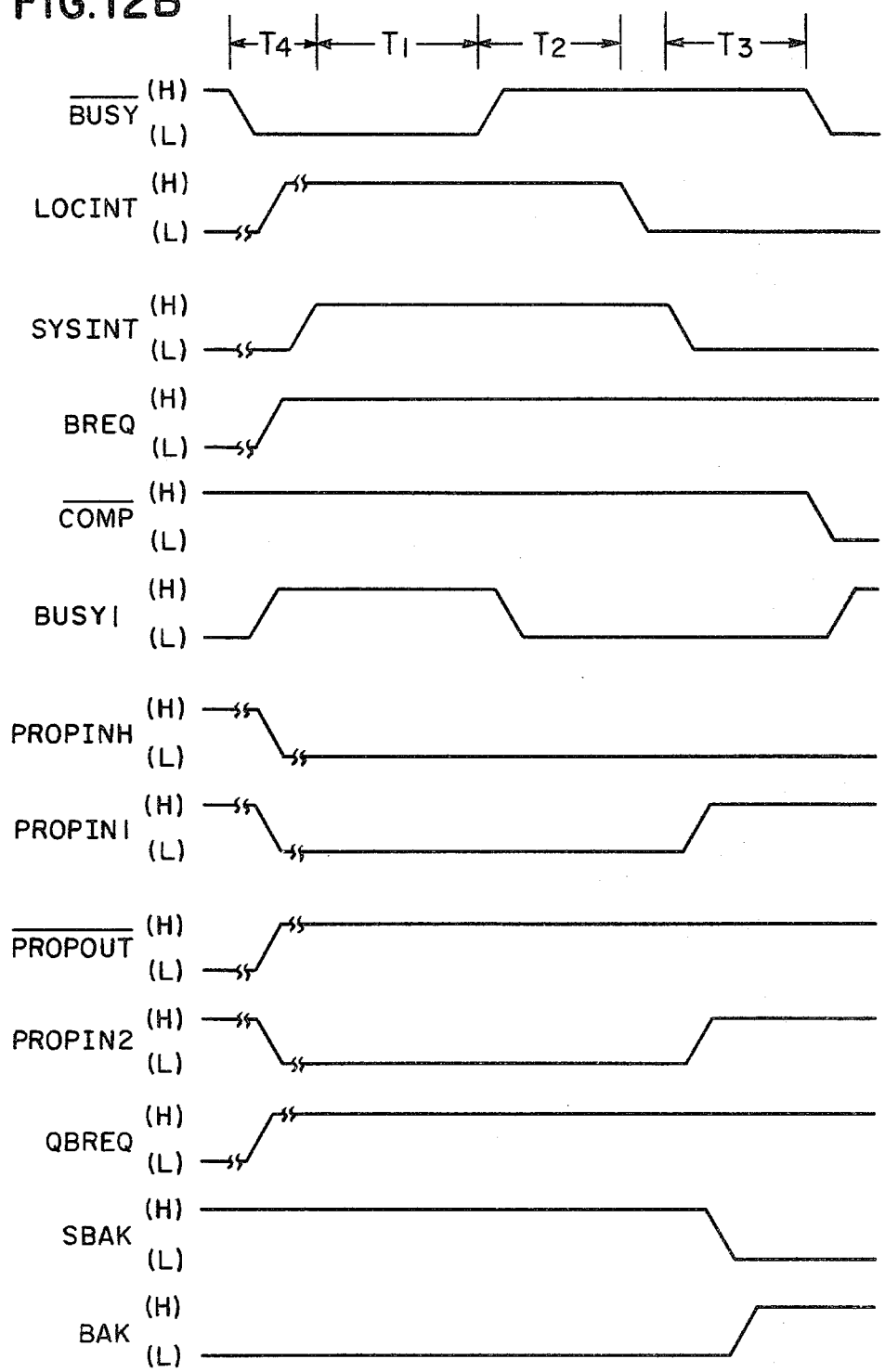

Referring to FIG. 12B, the waveforms of the first arbitrator circuit 90A in a serial arbitrator chain are shown assuming a bus request is pending, hence BREQ is high. The generation of the system interrogation signal (SYSINT) and local interrogation signal (LOCINT) occurs as in the case above in response to the system command signal $\overline{BUSY}$. During time $T_1$ the inputs to NAND gate 72 have all been qualified, and latching Schmitt trigger circuit 74 is set, hence output Q (QBREQ) of circuit 74 is high. Since the input to NOR gate 68 is high, the output propagate inhibit signal (PROPINH) is held low, which in turn disables NAND gate 67 and inhibits the system interrogation signal from propagating through, i.e. the output of NAND gate 67 ($\overline{PROPOUT}$) is held high. When gate 70 output (PROPIN2) goes high, the output of NAND gate 76 (SBAK) is then totally qualified, setting Latch 77' causing the bus acknowledge (BAK) signal to go high. (In turn, the $\overline{BAK}$ signal, which is an input to NAND gate 53 goes low, causing $\overline{BUSY}$ to go low, halting the system interrogation process. The system, recognizing $\overline{BUSY}$ is driven low, causes COMP to go high. After the external device has completed its use of the bus, COMP at a high level enables the bus release signal $\overline{BRL}$ going low to reset the Latch 77' through NAND gate 40. Also COMP at a high level enables $\overline{BUSY}$ to be released to go high through NAND gate 52 as soon as the bus acknowledge Latch 77' is reset and continue the system interrogation of the serial arbitration chain.).

Figure 12C:
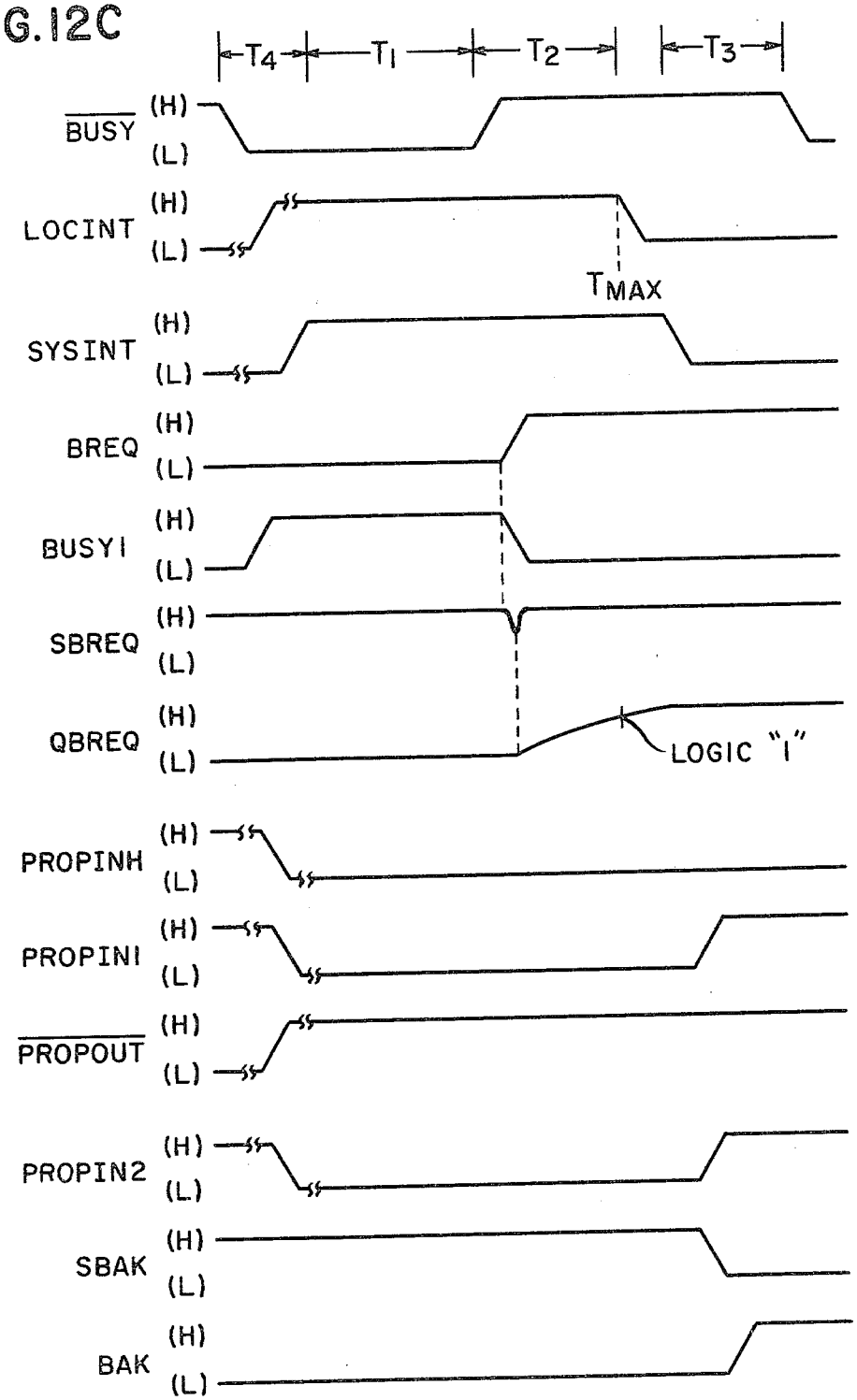

Referring to FIG. 12C, the waveforms of the first arbitrator circuit 90A in a serial arbitration chain are shown. This case shows the bus request signal at the input of NAND gate 72 occurring simultaneously with the BUSY1 input to NAND gate 72. The result is a "runt" pulse out of NAND gate 72 (SBREQ), which is the input to the latching Schmitt trigger circuit 74. Because the energy contained in the input runt pulse is low, the latching Schmitt trigger may not switch states as quickly as it normally would, if at all. This is characteristic of many bistable circuits. As has been mentioned previously, in order for the arbitration circuit to function properly, the output of the bistable circuit, in this case the latching Schmitt trigger circuit 74, must reach its final state within some maximum time, $T_{max}$. If the bistable circuit tends to metastability it might oscillate between a logic 1 and a logic 0, yielding unreliable results and thereby permitting two or more devices access to the bus simultaneously. The output of circuit 74 (QBREQ) shown in FIG. 12C reaches a logic 1 before $T_{max}$. As a result, the output of NOR gate 68 (PROPINH) is held low first by the local interrogation signal (LOCINT) and then by the Q output of latching Schmitt trigger circuit (QBREQ) going high before the local interrogation signal goes low. The low output of NOR gate 68 (PROPINH), disables NAND gate 67, thereby inhibiting the system interrogation signal from being propagated to the next intermediate arbitrator circuits. The bus acknowledge signal (BAK) and the remainder of the circuit operates in its normal fashion as described for the case relating to FIG. 12B.

Figure 12D:
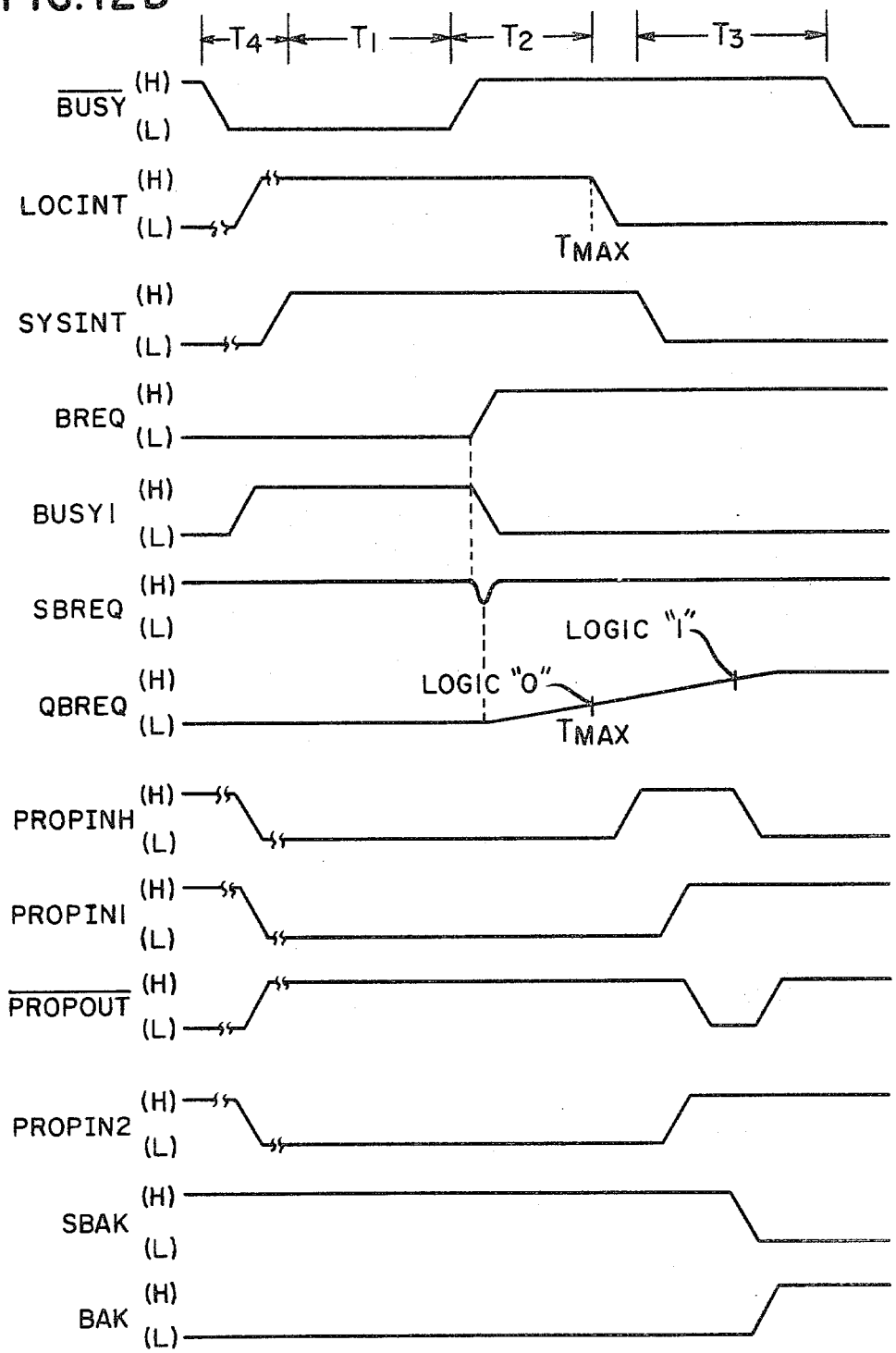

Referring to FIG. 12D, shows the case when a bistable circuit does not reach its final state within the specified maximum time, $T_{max}$.

At the interrogation time, $T_{max}$, the output of the bistable circuit (QBREQ) is at a logic zero. As a result, the output of NOR gate 68 (PROPINH) goes high qualifying NAND gate 67 allowing $\overline{PROPOUT}$ to go low when the output of NAND gate 66 (PROPIN1) goes high as a result of the system interrogate signal commencing the interrogation sequence. If a bus request were pending at the next arbitrator circuit 90B, then gate 76 (of circuit 90B) would be enabled and Latch 77' (of circuit 90B) would be set resulting in a bus acknowledge signal from circuit 90B. In the meantime, the output of circuit 74 (QBREQ) continues to rise until it reaches a logic 1, totally enabling the output of gate 76 (SBAK) (of the first arbitrator circuit 90A) causing a bus acknowledge signal (BAK) from the first circuit 90A. In this case two devices could be given access to the bus. An arbitrator could be implemented using a bistable circuit with a slow switching time. However, in order to avoid the above problem, the time $T_{max}$ must be made larger, thereby slowing down the interrogation process. The latching Schmitt trigger circuit 74 which exhibits fast switching times and does not tend to metastability, i.e. reliably reaches its final state in a short time, makes it useful in the implementation of the high speed arbitration circuit described above.

Figure 13D:
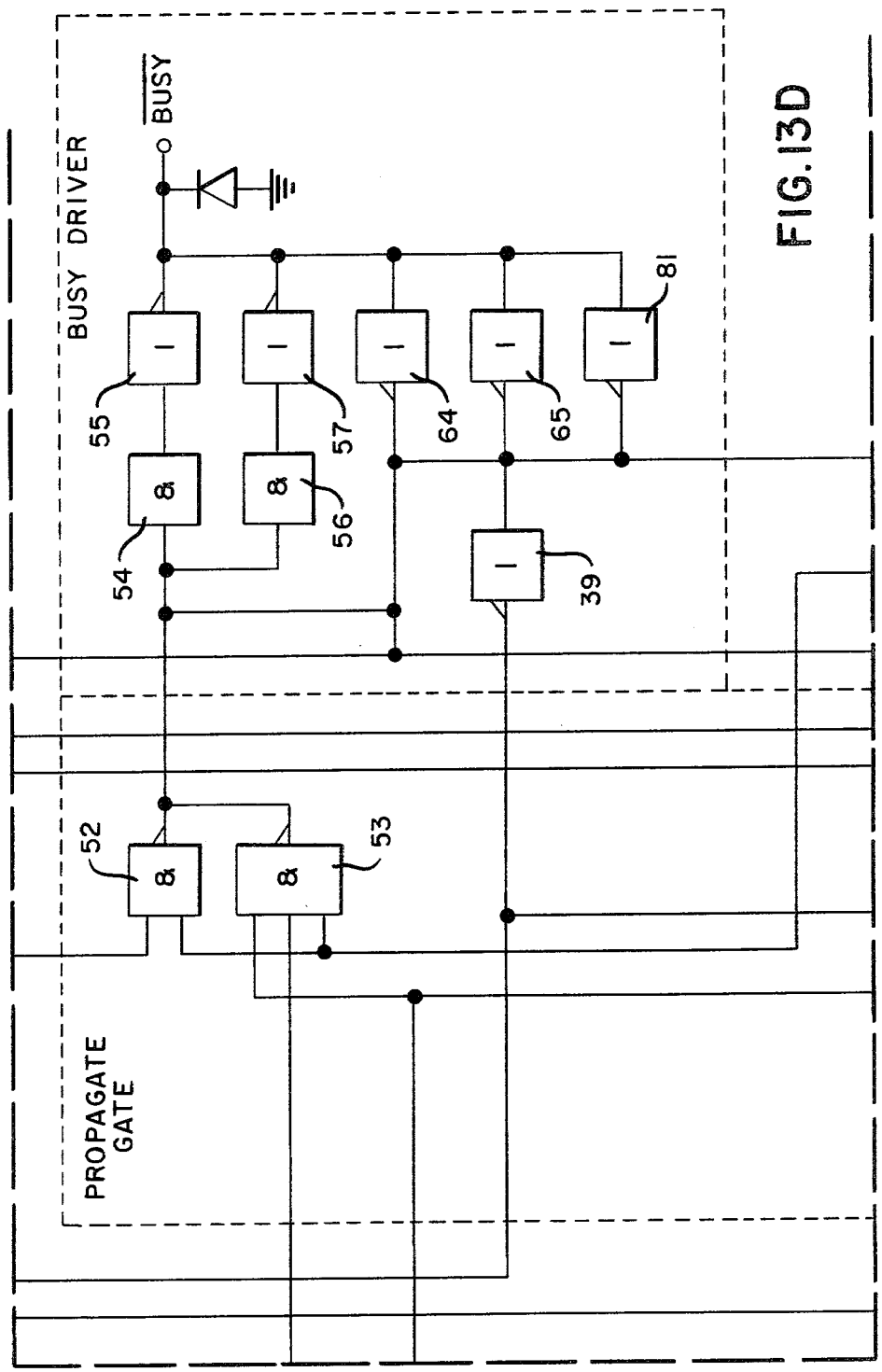
Figure 13E:
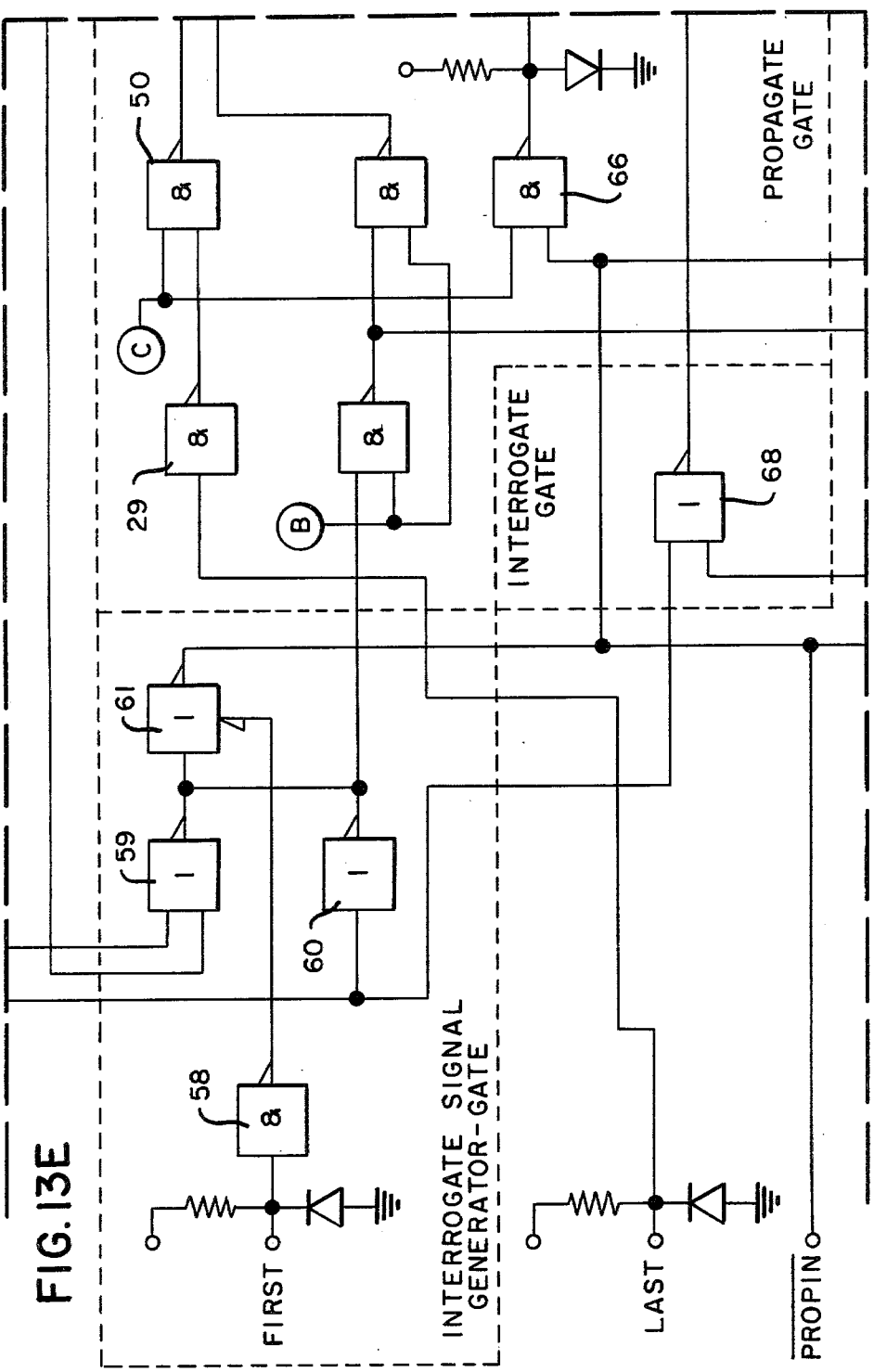
Figure 14:
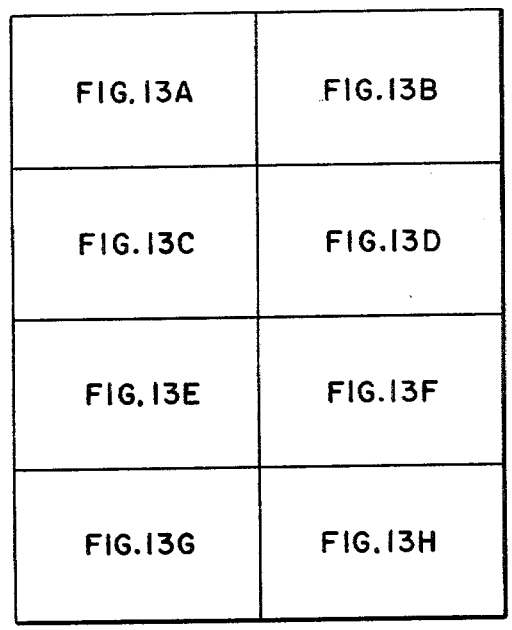

FIG. 13 shows the complete arbitrator circuit which includes inputs such as, SLOW, override ($\overline{OVRD}$), lock (LOCK) and reset (RST) but are not described herein. These inputs provide additional features for the arbitration circuit and are not necessary for the understanding of the time-critical arbitration function described above.

While there has been shown what is considered to be the preferred embodiments of the present invention, it will be manifest that many changes and modifications may be made therein without departing from the essential spirit of the invention. It is intended, therefore, in the annexed claims, to cover all such changes and modifications as may fall within the true scope of the invention.

What is claimed is:

1. A latching Schmitt trigger circuit, comprising:
   (a) first and second input terminals for unilaterally switching said latching Schmitt trigger circuit;
   (b) first and second current carrying devices having first, second, and third electrodes, said first electrode being the control electrode and said second and third electrodes being the current carrying electrodes, said second electrode of said first current carrying device connected to said second electrode of said second current carrying device, and said third electrode of said first current carrying device connected to said first electrode of said second current carrying device;
   (c) first, second, and third unilateral current flow devices having a current input terminal and a current output terminal,
      said current output terminal of said first unilateral current flow device connected to said first input terminal, and said current input terminal of said first unilateral current flow device connected to said first electrode of said first current carrying device, said current input terminal of said second and third unilateral current flow devices connected together to form a single junction point, said current output terminal of said second unilateral current flow device connected to said first electrode of said first current carrying device, and
      said current output terminal of said third unilateral current flow device connected to said third electrode of said second current carrying device;
   (d) first and second resistive elements, said first resistive element connected between said second input terminal and said first electrode of said first current carrying device, and said second resistive element connected between a power source and said first electrode of said first current carrying device;
   (e) a third resistive element connected between said power source and said single junction point, said third resistive element, in combination with said first and second resistive elements, forming a voltage divider network for biasing of said first current carrying device;
   (f) a fourth resistive element connected between a zero voltage potential level and the common connection of said second electrode of said first current carrying device and said second electrode of said second current carrying device, providing a feedback path for a regenerative action; and
   (g) fifth and sixth resistive elements, said fifth and sixth resistive elements connected between said third electrodes of said first and second current carrying devices, respectively, and said power source, for current limiting said first and second current carrying devices.

2. A latching Schmitt trigger circuit according to claim 1 wherein:
   (a) said first and second current carrying devices are semiconductor transistors; and
   (b) said first, second, and third unilateral current flow devices are semiconductor diodes.

3. A latching Schmitt trigger circuit according to claim 1, which further comprises:
   an output driver stage having an input and output, said input connected to said third electrode of said second current carrying device, and said output being the output of the latching Schmitt trigger circuit.

4. A latching Schmitt trigger circuit according to claim 3, wherein said output driver stage comprises:
   a first, second, third and fourth semiconductor transistor each having a base, emitter and collector terminal, the base of said first semiconductor transistor being the input of said output driver stage, the emitter of said first semiconductor transistor coupled to the base of said second semiconductor transistor, the collector of said first semiconductor transistor connected to the collector of said second semiconductor transistor, the emitter of said second semiconductor transistor coupled to the base of said third semiconductor transistor, the emitter of said third semiconductor transistor coupled to the base of said fourth semiconductor transistor, the collector of said fourth semiconductor transistor being the output of said output driver stage.

5. A latching Schmitt trigger circuit, comprising:
   (a) a first and second input terminals adapted to receive a first control signal for causing said latching Schmitt trigger circuit to be placed in a first stable state and a second control signal for causing said latching Schmitt trigger circuit to be placed in a second stable state respectively;
   (b) first and second transistors each having a base electrode, an emitter electrode and a collector electrode, the emitter electrode of said first transistor connected to the emitter electrode of said second transistor, and the collector electrode of said first transistor connected to the base electrode of said second transistor;
   (c) first, second and third diodes having an anode terminal and a cathode terminal,
      (i) the cathode terminal of said first diode connected to said first input terminal,
      (ii) the anode terminal of said first diode connected to the base electrode of said first transistor,
      (iii) the anode terminal of said second and third diodes together to form a single junction point,
      (iv) the cathode terminal of said second diode connected to the base electrode of said first transistor, and
      (v) the cathode terminal of said third diode connected to the collector electrode of said second transistor;
   (d) first and second resistive elements, said first resistive element connected between said second input terminal and the base electrode of said first transistor, and said second resistive element connected between a positive voltage power source and base electrode of said first transistor;
   (e) a third resistive element connected between said positive voltage power source and said single junction point, said third resistive element, in combination with said first and second resistive elements, forming a voltage divider network for biasing of said first transistor;
   (f) a fourth resistive element connected between a zero voltage potential level and the common connection of the emitter electrode of said first transistor and the emitter electrode of said second transistor, providing a feedback path for an enhanced regenerative action;
   (g) fifth and sixth resistive elements, said fifth and sixth resistive elements connected between the collector electrodes of said first and second transistors, respectively, and said positive voltage power source, for current limiting said first and second transistors; and (h) an output driver stage having an input and output, said input connected to collector electrode of said second transistor, and said output being the output of said latching Schmitt trigger circuit having an output signal in response to said first and second control signals.

6. A latching Schmitt trigger circuit according to claim 5 wherein the output signal of said latching Schmitt trigger circuit has a voltage in response to said first and second control signal which comprises:

(a) a first voltage period at a ground or zero voltage level corresponding to a logic zero value, said first control signal being at an initial positive voltage corresponding to a logic one value and sufficiently higher than a voltage level at the base electrode of the first transistor, and said second control signal at an initial ground or zero voltage level corresponding to a logic zero value;

(b) a second voltage period at a positive voltage level corresponding to a logic one in response to the first control signal going at least more negative than the voltage level at the base electrode of said first transistor, and the second control signal remaining at the logic zero value;

(c) a third voltage period in which the voltage level of the output signal remains at the same voltage level as that of said second voltage period by the action of said second and third diode, said second diode assisting in maintaining the voltage at the base electrode of said first transistor to the value corresponding to that attained during the second voltage period of said output signal and said third diode maintaining the collector electrode of said second transistor at a voltage reduced from that of said first voltage period after the first control signal has returned to the initial high positive voltage corresponding to a logic one value, and said second control signal maintained at the logic zero level;

(d) a fourth voltage period at a ground or zero voltage level corresponding to a logic zero value in response to the second control signal going sufficiently positive corresponding to the logic one value and at least sufficiently positive to cause the voltage level at the base electrode of said first transistor to be more positive than the emitter electrode of said first transistor, and the first control signal remaining at the logic one value; and (e) a fifth voltage period wherein the output signal remains at the same voltage level as that of said fourth voltage period after the second control signal has returned to the initial ground or zero voltage level, said second diode assisting in maintaining the voltage at the base electrode of the first transistor at the value corresponding to that attained during the fourth voltage period.

7. A bistable circuit, comprising:

(a) a basic Schmitt trigger circuit having an input node and an output node and operating to switch between first and second operating states as the voltage on said input node traverses high and low voltage thresholds of said basic Schmitt trigger circuit;

(b) first and second control terminals adapted to receive first and second control signals;

(c) a first and second resistor forming a voltage divider network, each resistor having two leads, the first lead of said first and second resistor connected together to form a bias voltage junction, said bias voltage junction connected to the input node of said basic Schmitt trigger circuit, the second lead of said first resistor forming a terminal adapted to receive a voltage power source and the second lead of said second resistor coupled to said second control terminal;

(d) a semiconductor diode operatively connected between said first control terminal and said voltage divider network for isolating said first control terminal from said voltage divider network;

(e) a first and second semiconductor diode, each having a cathode lead and an anode lead; and (f) a resistor having two leads, the first lead of said resistor and the anode leads of said first and second semiconductor diodes connected to form a common junction, the cathode lead of said first semiconductor diode operatively connected to the input node of said basic Schmitt trigger circuit, the cathode lead of said second semiconductor diode operatively connected to the output node of said basic Schmitt trigger circuit, and the second lead of said resistor connected to a power supply source, said resistor and said first and second semiconductor diode cooperating with said voltage divider network for maintaining said basic Schmitt trigger circuit in said first or second operating state in the absence of said first or second control signal.

8. A bistable circuit according to claim 7, which further comprises:

an output driver stage operatively connected to the output node of said basic Schmitt trigger circuit.

* * * * *